United States Patent [19]
Wilson et al.

[11] 4,335,437
[45] Jun. 15, 1982

[54] CIRCUIT INTERRUPTER WITH ENERGY MANAGEMENT FUNCTIONS

[75] Inventors: John T. Wilson; John A. Wafer, both of Beaver; Joseph C. Engel, Monroeville, all of Pa.

[73] Assignee: Westinghouse Electric Corp., Pittsburgh, Pa.

[21] Appl. No.: 140,554

[22] Filed: Apr. 15, 1980

[51] Int. Cl.³ ..................... H02H 3/08; G06F 15/56
[52] U.S. Cl. .................... 364/483; 364/492; 361/68; 361/82
[58] Field of Search .............. 364/483, 492; 361/68, 361/82

[56] References Cited

U.S. PATENT DOCUMENTS

| | | | |
|---|---|---|---|
| 3,778,637 | 12/1973 | Arita | 364/492 X |
| 3,783,988 | 1/1974 | Kinemura | 364/492 X |
| 3,818,275 | 6/1974 | Shimp | 317/33 |
| 3,885,199 | 5/1975 | Hohara et al. | 364/483 X |
| 3,931,502 | 1/1976 | Kohlas | 364/492 |
| 3,956,670 | 5/1976 | Shimp et al. | 317/36 TD |
| 4,107,778 | 8/1978 | Nii et al. | 364/492 |
| 4,120,031 | 10/1978 | Kincheloe et al. | 364/483 X |
| 4,161,027 | 7/1979 | Russell | 364/119 X |
| 4,168,491 | 9/1979 | Phillips et al. | 364/492 X |
| 4,187,525 | 2/1980 | Nagura et al. | 364/482 X |
| 4,219,858 | 8/1980 | DePuy | 364/483 X |

OTHER PUBLICATIONS

Results of Field Experiments of Digital Relays Utilizing Minicomputer and Microprocessor, Suzuki et al., IFAC Conference on Automatic Control and Protection of Electrical Power Systems, Feb. 1977, pp. 312-316.
Motor Protective Relay IC305 MLTA, Descriptive Bulletin, General Electric, Dec. 1979.
"Micro Versa Trip Programmer . . . ", G. C. Eckart, Industrial Power Systems, Jun. 1979.
Operating and Instruction Guide, Matco Energy Monitor.

Primary Examiner—Edward J. Wise
Attorney, Agent, or Firm—Robert E. Converse, Jr.

[57] ABSTRACT

A circuit interrupter includes a digital trip unit containing a microprocessor. The circuit interrupter also includes current transformers for sensing current flow through the contacts of the interrupter and for providing operating power to the trip unit. The current transformers monitoring current flow through the breaker and control potentiometers receiving operator-entered values of the product of line voltage and power factor are connected to the microprocessor to supply it with the values needed to compute real power flow through the interrupter and to display the numeric value of this power flow. The power flow is compared to an operator-entered limit value of peak demand power, and an alarm signal is generated whenever power flow exceeds the limit value peak demand. Integration capability is also provided to calculate energy flow through the contacts in megawatt hours and to present the numeric value of this energy flow.

10 Claims, 29 Drawing Figures

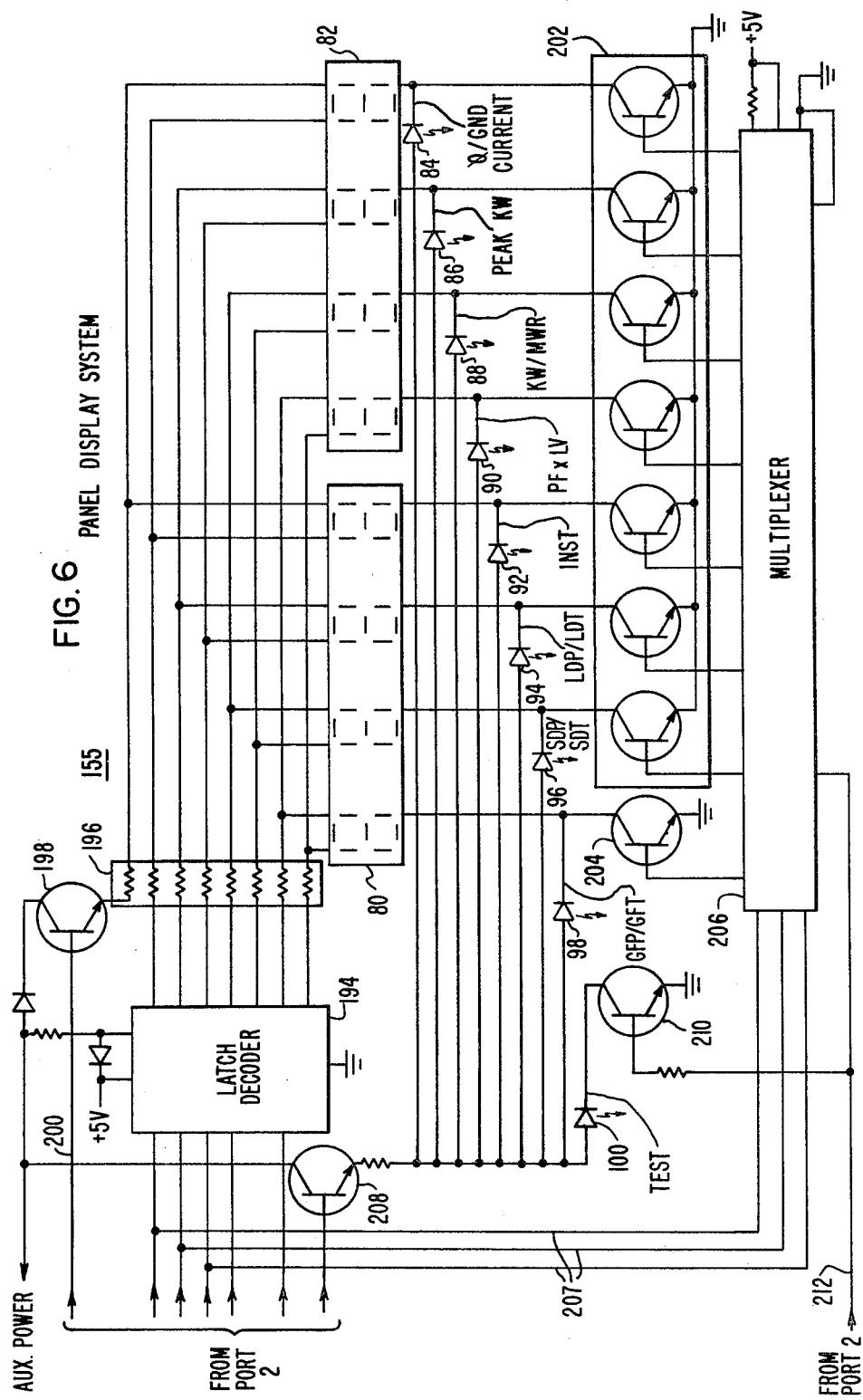
FIG. 6 PANEL DISPLAY SYSTEM

STYLE NUMBER DESIGNATOR

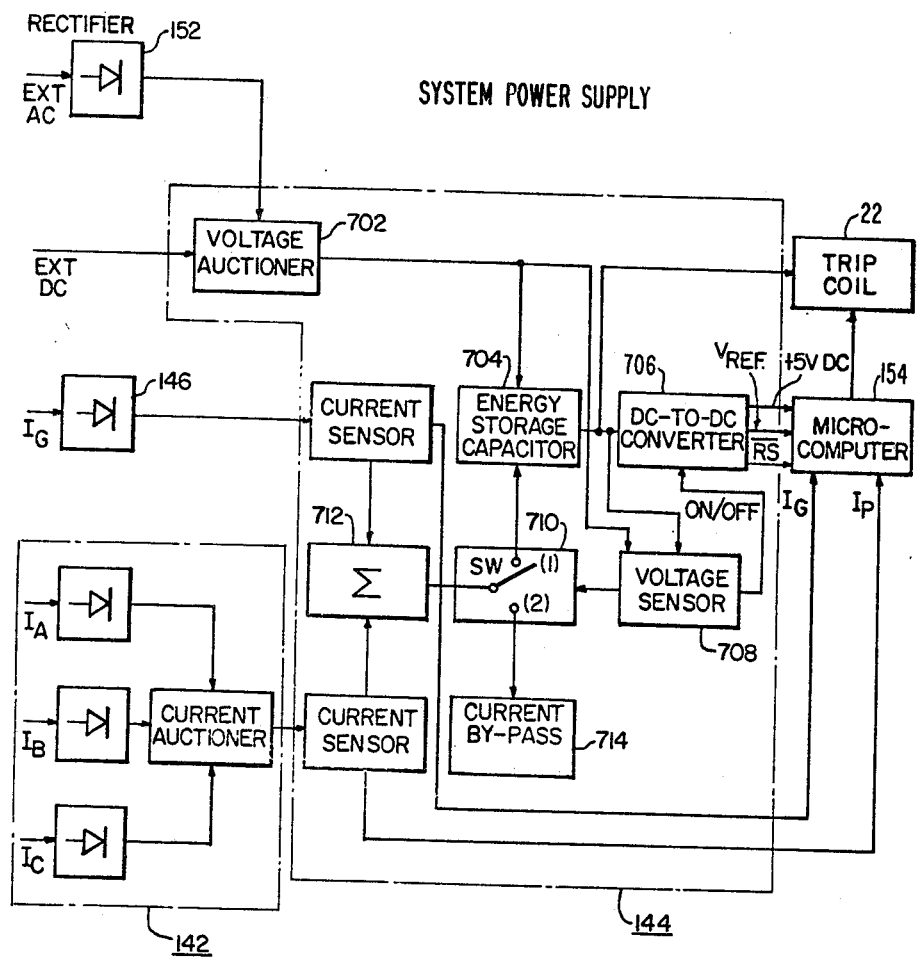
FIG.II.

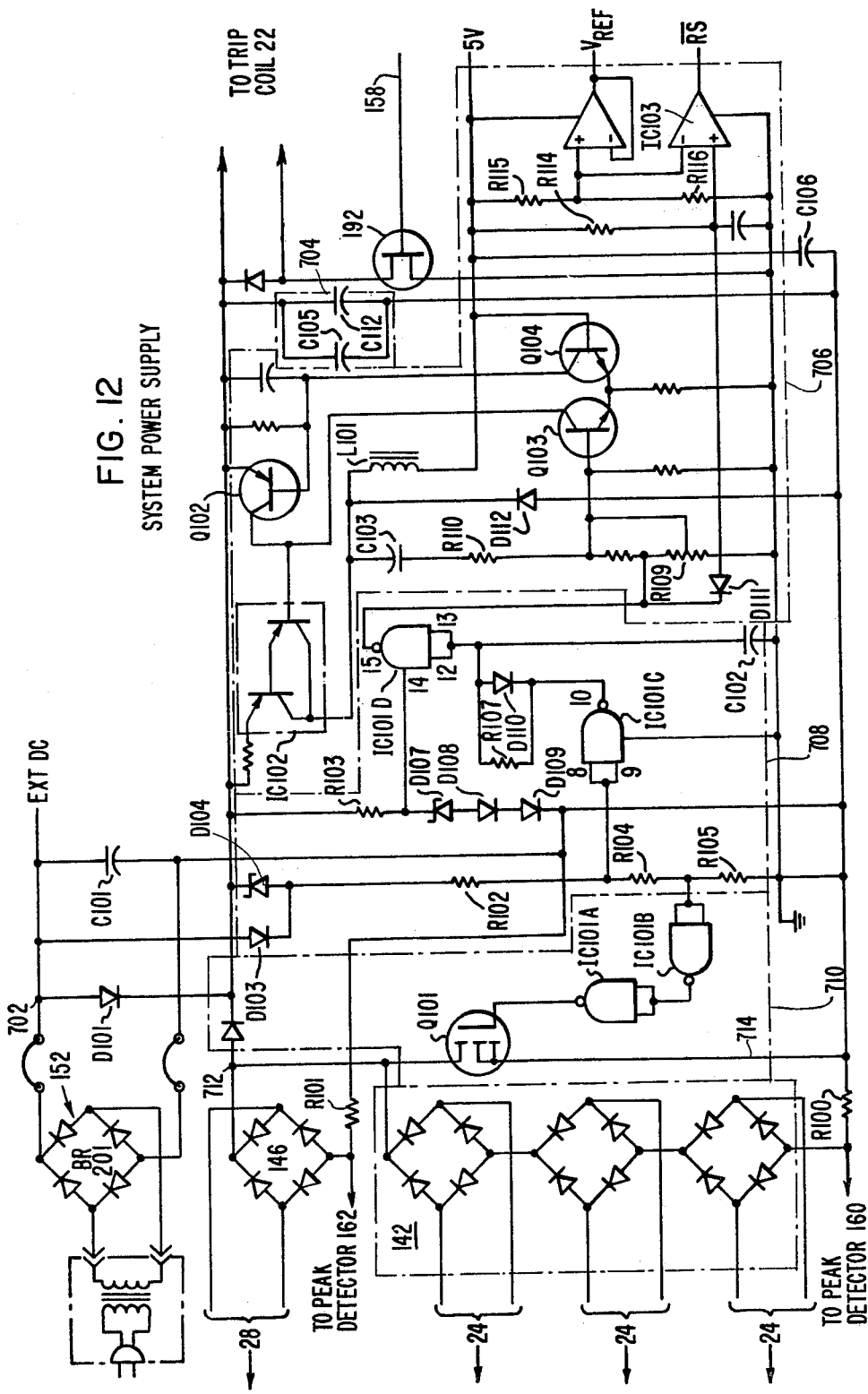

CIRCUIT INTERRUPTER WITH ENERGY MANAGEMENT FUNCTIONS

CROSS-REFERENCE TO RELATED APPLICATIONS

The present invention is related to material disclosed in the following copending U.S. patent applications, all of which are assigned to the same assignee of the present application.

Ser. No. 140,559, "Circuit Interrupter With Solid State Digital Trip Unit" filed Apr. 15, 1980 by J. C. Engel;

Ser. No. 140,631, "Circuit Interrupter With Front Panel Numeric Display" filed Apr. 15, 1980 by J. C. Engel, R. T. Elms, and G. F. Saletta;

Ser. No. 140,632, "Circuit Interrupter With Solid State Digital Trip Unit And Positive Power-Up Feature" filed Apr. 15, 1980 by R. T. Elms, G. F. Saletta, and B. J. Mercier;

Ser. No. 140,627, "Circuit Interrupter With Digital Trip Unit And Optically-Coupled Data Input/Output System" filed Apr. 15, 1980 by J. C. Engel, J. A. Wafer, J. T. Wilson, and R. T. Elms;

Ser. No. 140,628, "Circuit Interrupter With Digital Trip Unit And Style Designator Circuit" filed Apr. 15, 1980 by J. J. Matsko, E. W. Lange, J. C. Engel, and B. J. Mercier;

Ser. No. 140,504, "Circuit Interrupter With Overtemperature Trip Device" filed Apr. 15, 1980 by J. J. Matsko, and J. A. Wafer;

Ser. No. 140,553, "Circuit Interrupter With Digital Trip Unit And Means To Enter Trip Settings" filed Apr. 15, 1980 by R. T. Elms, J. C. Engel, B. J. Mercier, G. F. Saletta, and J. T. Wilson;

Ser. No. 140,626, "Circuit Interrupter With Digital Trip Unit And Power Supply" filed Apr. 15, 1980 by J. C. Engel, J. A. Wafer, R. T. Elms, and G. F. Saletta;

Ser. No. 140,557, "Circuit Interrupter With Multiple Display And Parameter Entry Means" filed Apr. 15, 1980 by J. J. Matsko, J. A. Wafer, J. C. Engel, and B. J. Mercier;

Ser. No. 140,556, "Circuit Interrupter With Remote Indicator And Power Supply" filed Apr. 15, 1980 by J. C. Engel, J. A. Wafer, B. J. Mercier, and J. J. Matsko;

Ser. No. 140,625, "Circuit Interrupter With Digital Trip Unit And Automatic Reset" filed Apr. 15, 1980 by B. J. Mercier and J. C. Engel; and Ser. No. 140,558, "Circuit Interrupter With Digital Trip Unit And Potentiometers For Parameter Entry" filed Apr. 15, 1980 by J. C. Engel, B. J. Mercier, and R. T. Elms.

BACKGROUND OF THE INVENTION

1. Field of the Invention

The invention relates to circuit interrupters having means for electronically analyzing the electrical conditions on the circuit being protected and for automatically opening to interrupt the current flow whenever electrical conditions exceed predetermined limits.

2. Description of the Prior Art

Circuit breakers are widely used in industrial and commercial applications for protecting electrical conductors and apparatus connected thereto from damage due to excessive current flow. Although initially used as direct replacements for fuses, circuit breakers were gradually called upon to provide more sophisticated types of protection other than merely interrupting the circuit when the current flow exceeded a certain level. More elaborate time-current trip characteristics were required such that a circuit breaker would rapidly open upon very high overload conditions but would delay interruption upon detection of lower overload currents, the delay time being roughly inversely proportional to the degree of overload. Additionally, circuit breakers were called upon to interrupt upon the detection of ground fault currents. As the complexity of electrical distribution circuits increased, the control portions of circuit breakers were interconnected to provide selectivity and coordination. This allowed the designer to specify the order in which the various circuit breakers would interrupt under specified fault conditions.

During the late 1960's, solid state electronic control circuits were developed for use in high power low voltage circuit breakers. These control circuits performed functions such as instantaneous and delayed tripping which were traditionally achieved by magnetic and thermal means. The improved accuracy and flexibility of the solid state electronic controls resulted in their wide-spread acceptance, even though the electronic control circuits were more expensive than their mechanical counterparts.

The earliest electronic control circuit designs utilized discrete components such as transistors, resistors, and capacitors. More recent designs have included integrated circuits which have provided improved product performance at a slightly reduced cost.

As the cost of energy continues its rapid rise, there is increasing interest in effectively controlling the usage of electrical energy through the design of more sophisticated electrical distribution circuits. Therefore, there is required a circuit breaker providing a more complex analysis of electrical conditions on the circuit being protected and even greater capability for coordination with other breakers. As always, it is extremely desirable to provide this capability at the same or lower cost.

Energy monitors have been used in the past to calculate and display power demand and energy usage. However, they have required installation of separate components in addition to the protective equipment provided on the electrical distribution system. It would therefore be desirable to provide a circuit interrupter with the ability to monitor and display a variety of energy functions to aid in the management of energy usage.

SUMMARY OF THE INVENTION

In accordance with the principles of the present invention there is provided circuit interrupter apparatus including interrupter means for conducting current flow through an associated circuit and for interrupting the current flow on command, means for sensing current flow through the interrupter means and for supplying operating power to said apparatus; means connected between the interrupter means and the sensing means for operating the interrupter means when current flow therethrough exceeds a predetermined time-current trip characteristic, means for determining line voltage on the associated circuit, means for determining power factor on the associated circuit, means connected to the current sensing means, the line voltage determining means, and the power factor determining means for calculating the real power delivered by the associated circuit; a housing enclosing the apparatus; and means visible from the exterior of the housing for displaying the numeric value of the product as real power being delivered through the apparatus.

BRIEF DESCRIPTION OF THE DRAWINGS

FIG. 6 is a detailed schematic diagram of the panel display system of FIG. 5.

FIG. 11 is a block diagram of the System Power Supply shown in FIG. 2;

FIG. 12 is a schematic diagram of the System Power Supply shown in FIG. 11;

DESCRIPTION OF THE PREFERRED EMBODIMENT

I. INTRODUCTION

A. Use of a Circuit Breaker in an Electrical Power Distribution System

Figure 3:
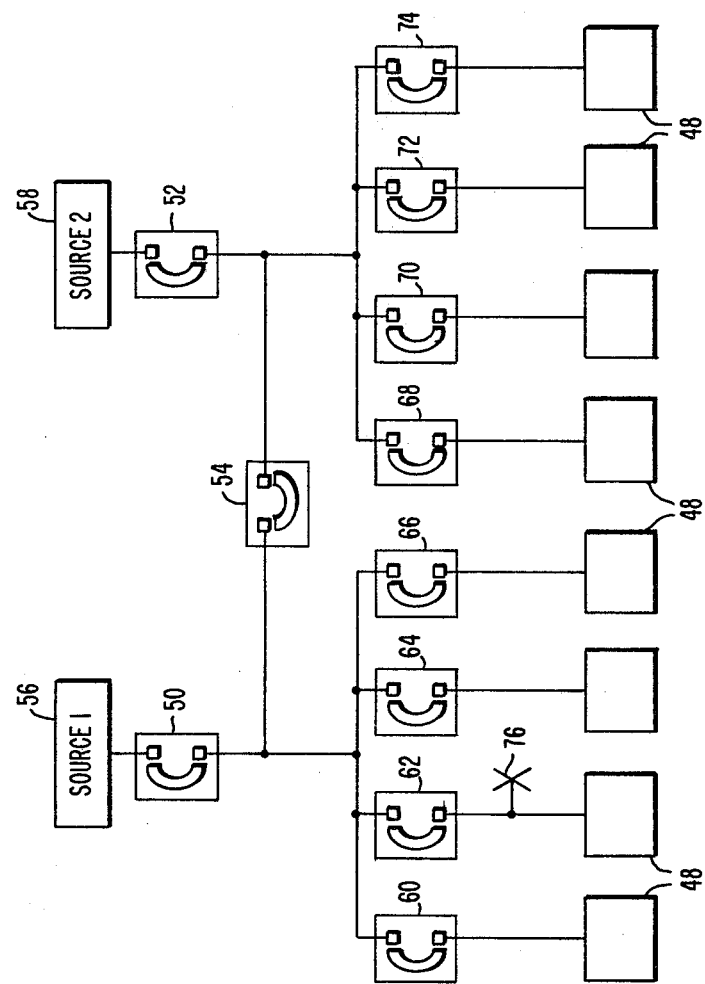
FIG. 3 is a block diagram of a typical electrical distribution system utilizing circuit breakers of the type shown in FIG. 1.

Before explaining the operation of the present invention, it will be helpful to describe in greater detail the function of a circuit breaker in an electrical power distribution circuit. FIG. 3 shows a typical electrical distribution system. A plurality of electrical loads 48 are supplied through circuit breakers 50, 52 and 54 from either of two sources of electrical energy 56 and 58. The sources 56 and 58 could be transformers connected to a high voltage electrical feeder line, a diesel-powered emergency generator, or a combination of the two. Power from the first source 56 is supplied through a first main circuit breaker 50 to a plurality of branch circuit breakers 60–66. Similarly, power from the second source 58 may be supplied through a second main circuit breaker 52 to a second plurality of branch circuit breakers 68–74. Alternatively, power from either source 56 or 58 may be supplied through the tie circuit breaker 54 to the branch circuit breakers on the opposite side. Generally, the main and tie circuit breakers 50, 52 and 54 are coordinated so that no branch circuit is simultaneously supplied by both sources. The capacity of the main and tie circuit breakers 50, 52 and 54 is usually greater than that of any branch circuit breaker.

If a fault (abnormally large current flow) should occur at, for example, the point 76, it is desirable that this condition be detected by the branch circuit breaker 62 and that this breaker rapidly trip, or open, to isolate the fault from any source of electrical power. The fault at the point 76 may be a large over-current condition caused, for example, by a short circuit between two of the phase conductors of the circuit, or an overload only slightly above the rating of the breaker caused by a stalled motor. Alternatively, it might be a ground fault caused by a breakdown of insulation on one of the conductors, allowing a relatively small amount of current flow to an object at ground potential. In any case, the fault would also be detected by the main or tie breakers 50, 52 or 54 through which the load fed by branch breaker 62 is supplied at the time of the fault. However, it is desirable that only the branch circuit breaker 62 operate to isolate the fault from the source of electrical power rather than the main or tie breakers. The reason for this is that if the main or tie circuit breaker should trip, electrical power would be lost to more than just the load attached in the branch circuit on which the fault occurred. It is therefore desirable that the main and tie circuit 50, 52 and 54 breakers should have a longer delay period following detection of a fault before they initiate a tripping operation. The coordination of delay times among the main, tie and branch circuit breakers for various types of faults is a major reason for the need to provide sophisticated control in a trip unit.

B. Time-Current Tripping Characteristics

In order to achieve the coordination between circuit breakers as described above, the time vs. current tripping characteristics of each circuit breaker must be specified. Circuit breakers have traditionally exhibited characteristics similar to that shown in FIG. 4, where both axes are plotted on a logarithmic scale. When current below the maximum continuous current rating of the breaker is flowing, the breaker will, of course, remain closed. As current increases, however, it is desirable that at some point, for example the point 300 of FIG. 4, the breaker should trip if thus overload current persists for an extended period of time. Should a current flow equal to the maximum continuous current rating as specified by point 300 persist, it can be seen from FIG. 4 that the breaker will trip in approximately 60 seconds.

At slightly higher values of current, the time required for the breaker to trip will be shorter. For example at 1.6 times maximum continuous current as specified by point 302, the breaker will trip in about 20 seconds. The portion of the curve between the points 300 and 304 is known as the long delay, or thermal, characteristic of the breaker, since this characteristic was provided by a bimetal element in traditional breakers. It is desirable that both the current level at which the long delay portion begins and the trip time required for any point on that portion be adjustable. These parameters are known as long delay pick-up and long delay time, respectively, and are indicated by the arrows 306 and 309.

At very high overcurrent levels, for example 12 times the maximum continuous current and above, it is desirable that the circuit breaker trip as rapidly as possible. This point 312 on the curve is known as the "instantaneous", or magnetic, trip level since traditional breakers employed an electromagnet in series with the contacts to provide the most rapid response. The instantaneous pick-up level is usually adjustable, as indicated by the arrow 314.

To aid in coordinating breakers within a distribution system, modern circuit breakers have added a short delay trip characteristic 316 between the long delay and instantaneous portions. The present invention allows adjustment of both the short delay pick-up level and the short delay trip time as indicated by the arrows 318 and 320.

Figure 4:
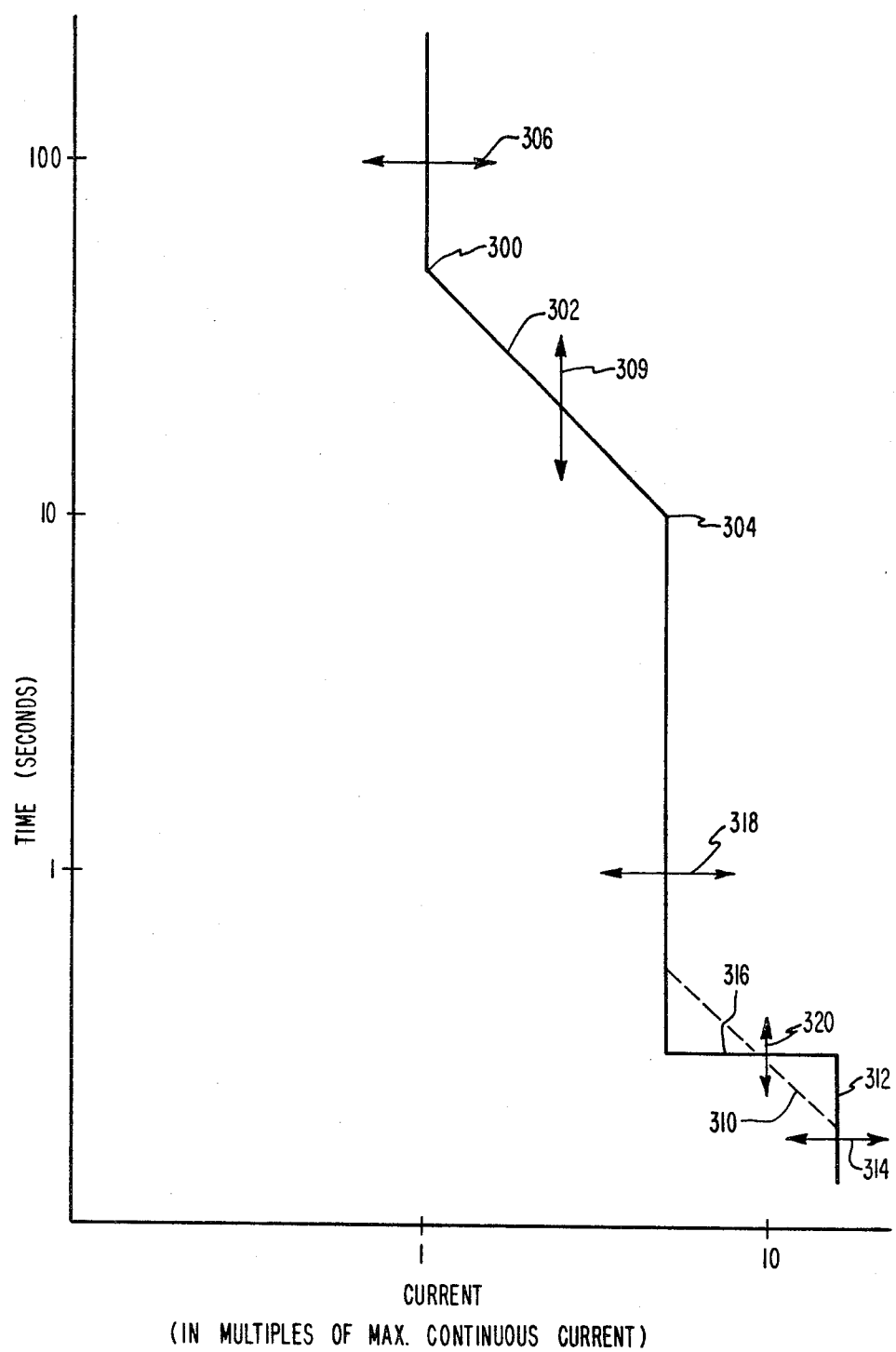
FIG. 4 is a graph of the time-current tripping characteristic of the circuit breaker shown in FIG. 1, plotted on a log-log scale.

Under certain conditions it is desirable that the trip time over the short delay portion also vary inversely with the square of the current. This is known as an $I^2t$ characteristic and is indicated in FIG. 4 by the broken line 310.

II. PHYSICAL AND OPERATIONAL DESCRIPTION

A. Circuit Breaker

Figure 1:
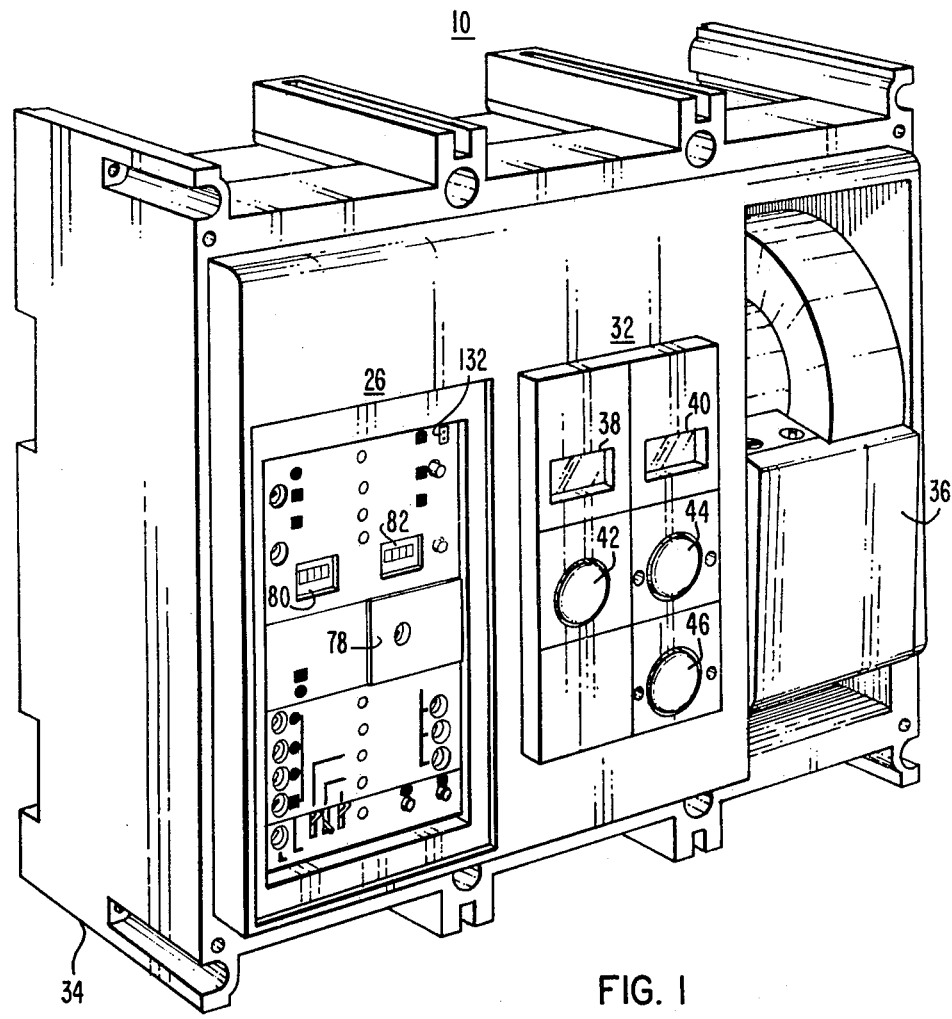
FIG. 1 is a perspective view of a circuit breaker embodying the principles of the present invention.
Figure 2:
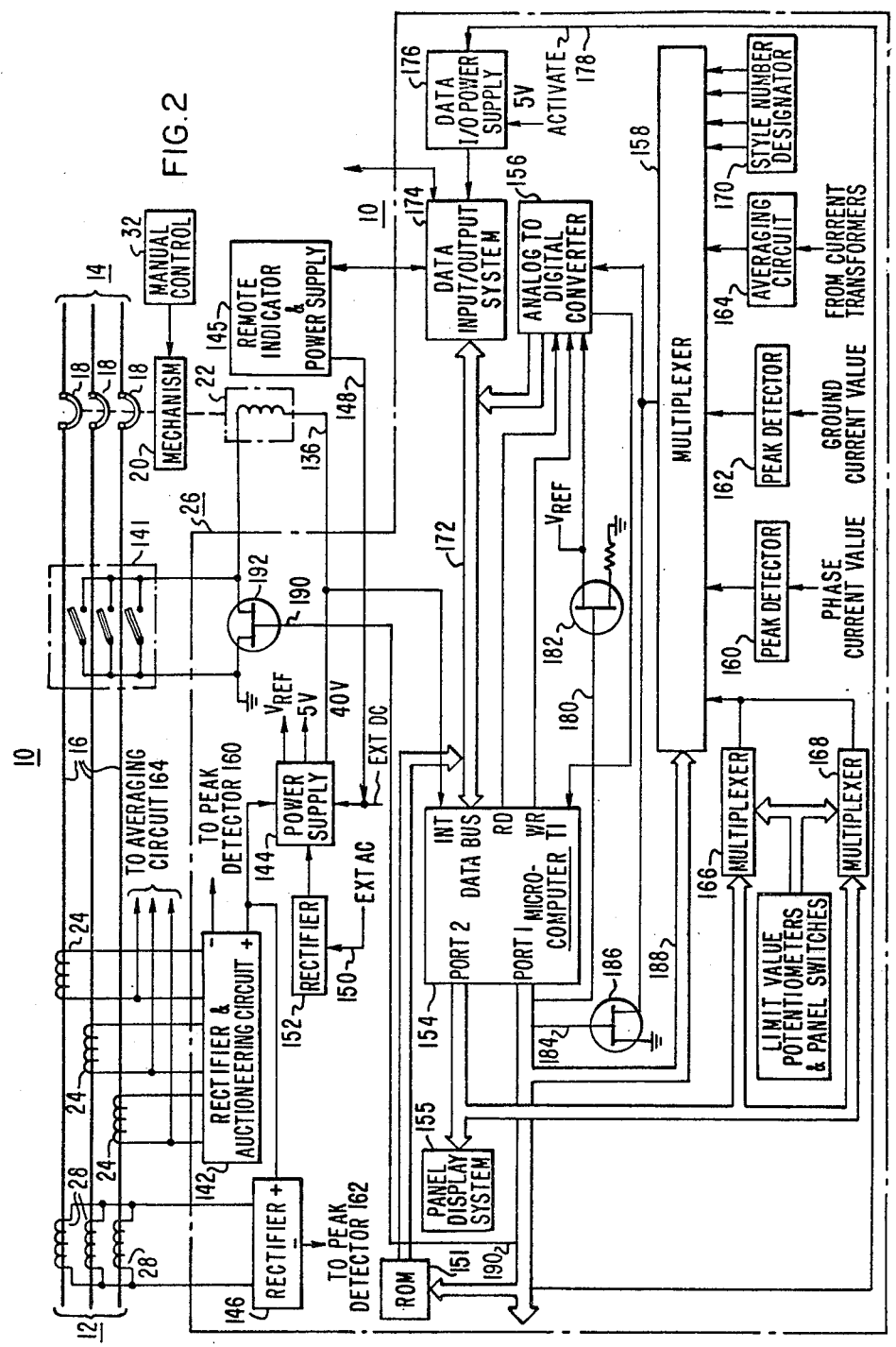
FIG. 2 is a functional block diagram of the circuit breaker of FIG. 1.

Reference may now be had to the drawings, in which like reference characters refer to corresponding components. A perspective view and a functional block diagram of a molded case circuit breaker 10 employing the principles of the present invention is shown in FIGS. 1 and 2, respectively. Although the circuit interrupter 10 is a three-pole circuit breaker for use on a three-phase electrical circuit, the invention is, of course, not so limited and could be used on a single-phase circuit or another type of multiphase circuit. A power source such as a transformer or switchboard bus is connected to input terminals 12 and an electrical load is connected to output terminals 14. Internal conductors 16 connected to the terminals 12 and 14 are also connected to interrupting contacts 18 which serve to selectively open and close an electrical circuit through the circuit breaker. The contacts 18 are mechanically operated by a mechanism 20 which responds to manually or automatically-initiated commands to open or close the contacts 18.

Current transformers 24 surround each of the internal phase conductors 16 to detect the level of current flow through the conductors 16. The output signal from the current transformers 24 is supplied to a trip unit 26, along with the output signal from a current transformer 28 which detects the level of ground fault current flowing in the circuit. The trip unit 26 constantly monitors the level of phase and ground fault currents flowing in the circuit to which the breaker 10 is connected and initiates a command signal to a trip coil 22 which actuates the mechanism 20 to open the contacts 18 whenever electrical conditions on the circuit being protected exceed predetermined limits stored in the trip unit 26. During normal conditions, the mechanism 20 can be commanded to open and close the contacts 18 through manually-initiated commands applied through the manual controls 32.

Referring to FIG. 1, it can be seen that the circuit breaker 10 includes a molded insulating housing 34. The terminals 12 and 14 are on the rear of the housing 34 and are thus not shown in FIG. 1. A handle 36 is mounted on the right-hand side of the housing 34 to allow an operator to manually charge a spring (not shown) in the mechanism 20. The manual controls 32 are positioned in the center of the housing 34. Windows 38 and 40 indicate the state of charge of the spring and the position of the contacts 18, respectively. A push-button 42 allows an operator to cause an internal electric motor to mechanically charge the spring in the same manner as the manual charging operation which can be performed by the handle 36. A pushbutton 44 allows an operator to cause the spring to operate the mechanism 20 to close the contacts 18. Similarly, a pushbutton 46 allows an operator to cause the spring and mechanism 20 to open the contacts 18.

B. Trip Unit

1. Front Panel

The panel of the trip unit 26 is positioned on the left side of the housing 34 as can be seen in FIG. 1. This panel, shown in more detail in FIG. 5, includes a plurality of indicator lights, potentiometers, numeric display devices, and switches, to permit an operator to observe the electrical parameters on the circuit being protected and the limit values presently stored in the trip unit, and to enter new limit values if so desired.

A rating plug 78 is inserted into the front panel of the trip unit 26 to specify the maximum continuous current to be allowed in the circuit being protected by the circuit breaker. This may be less than the actual capacity of the circuit breaker, which is known as the frame size. For example, the frame size for the circuit breaker may be 1,600 amperes; however, when the breaker is initially installed the circuit being protected may need to supply only 1,000 amperes of electrical current. Therefore, a rating plug may be inserted in the trip unit to ensure that the maximum continuous current allowed by the circuit breaker will be only 1,000 amperes even though the circuit breaker itself is capable of safely carrying 1,600 amperes.

Figure 5:
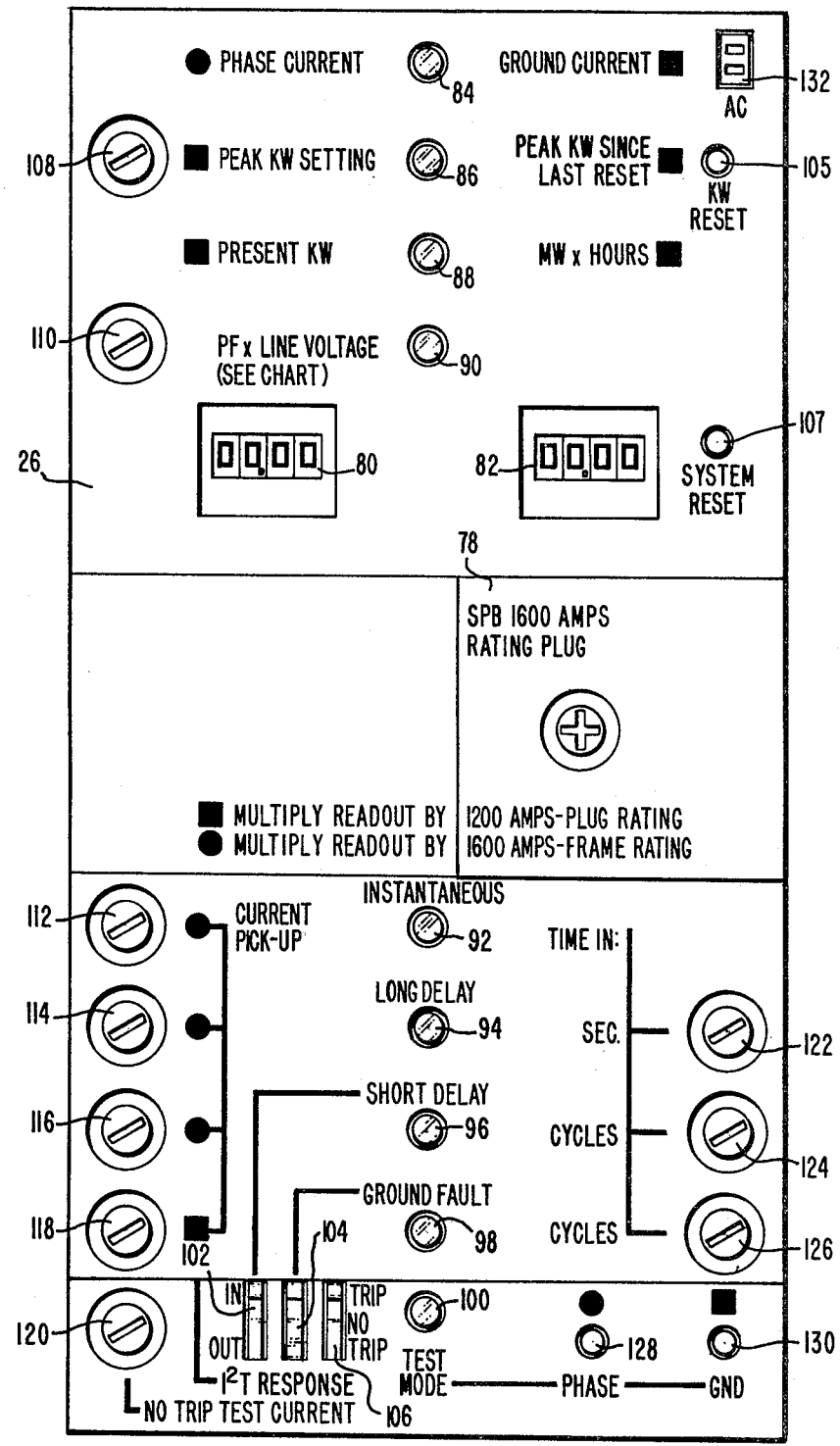
FIG. 5 is a detailed frontal view of the trip unit panel of the circuit breaker of FIGS. 1 and 2.

An auxiliary AC power receptacle 132 is located at the upper right of the trip unit panel, as seen in FIG. 5. This socket is used to supply auxiliary alternating current operating power (separate from the electrical circuit being protected) to the circuitry of the trip unit. The operation of this auxiliary AC power supply will be described more completely in section III.E.

2. Block Diagram

Referring to FIG. 2, it can be seen that the trip coil 22 is supplied with power through a conductor 136 from the power supply 144. The flow of current through the trip coil is controlled by a non-latching switching device such as a switching field effect transistor 192 actuated by the main trip unit circuitry. The use of a non-latching switch device instead of an SCR or other type of latching device as used in the prior art provides greater noise immunity.

In addition, the circuit breaker 10 includes three parallel-connected normally-open thermally activated switches 141 connected in parallel with FET 192. These switches are physically mounted on the conductors 16 in proximity to the contacts 18, with one switch mounted on each phase conductor 16.

Each switch 141 comprises a bimetal element which closes the switch contacts when the temperature of the associated conductor rises to 150° C. and resets when the conductor temperature falls below 130° C. Although a bimetallic switch is employed in the disclosed embodiment, other types of thermally activated switches such as thermistors could be mounted on the conductor. Alternatively, radiation sensors could be used. Infrared detectors could monitor the heat generated on the contacts or conductors, while ultraviolet or RF detectors could sense radiation generated by arcing contacts or terminals.

The switches 141 serve to directly energize the trip coil 22 upon high temperature conditions. In addition, the hardware interrupt line INT of the microcomputer is connected through the trip coil 22 to the high side of the switches 141 to signal the microcomputer 154 that a trip operation has occurred. This causes execution of appropriate instructions in internal read-only memory (ROM) of the microcomputer 154 to generate output data to a remote indicator 145. Since the mechanism 20 requires somewhat more than 30 ms. to open the contacts following a trip command, power is available for trip unit 26 to execute 2 complete operation cycles of the main loop program even if no external power is supplied. Alternatively, the switches 141 could be wired solely to the microcomputer 154 to allow it to initiate the trip operation and generate output data in the same manner as an overcurrent trip.

Information concerning electrical parameters on the circuit is provided by the three phase current transformers 24, each of which monitors current flow through the individual phase conductors of the circuit. The transformer 28 surrounds the three phase conductors of the circuit and detects currents which flow outward from a source through the phase conductors and then return through unauthorized paths through ground, commonly known as ground fault currents.

The signals from the current transformers 24 are supplied to a rectifier and auctioneering circuit 142 which provides a DC current proportional to the highest instantaneous AC current on any of the three phases. The circuit 142 provides normal operating power for the trip unit through a power supply 144. The transformers 24 and 28 act as current sources and are limited to supply power to the circuit 142 at approximately 40 volts. This is converted by the power supply 144 to three operating voltages: a 1.67 volt reference voltage labeled $V_{REF}$, a 5 volt operating voltage for the microcomputer and associated circuitry of the trip unit, and a 40 volt supply which operates the trip coil 22.

Information from the rectifier and auctioneering circuit 142 which is proportional to the present value of phase current is also supplied to the peak detector 160 of the main trip unit circuitry as indicated in FIG. 2.

The signal from the ground transformer 28 is supplied to a rectifier circuit 146 which provides an alternate source of operating power for the trip unit through the power supply 144, and also supplies information proportional to the present value of ground current to the peak detector 162 of the trip unit circuitry. An external DC source 148 of operating power on the order of about 40 volts may also be supplied to the power supply 144, as may be an external AC source 150 of operating power supplied through the trip unit front panel socket 132 to a rectifier 152 and then to the power supply 144.

Figure 5A:
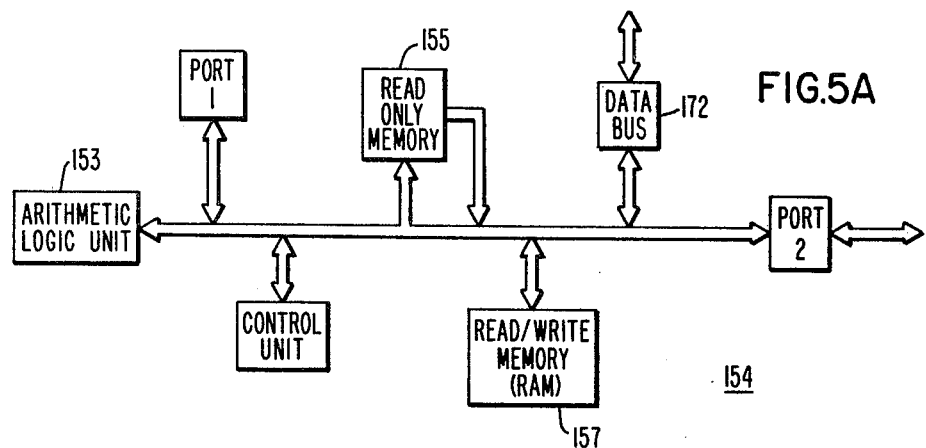
FIG. 5A is a block diagram of the microcomputer shown in FIG. 2.

The main trip unit circuitry includes an information processor and sequence controller 154 which may be, for example, a type 8048 microcomputer obtainable in commercial quantities from the Intel Corporation. A block diagram of the controller 154 is shown in FIG. 5A; however, a detailed description of the 8048 microcomputer may be obtained from the MCS-48 Microcomputer User's Manual, published by the Intel Corporation.

An analog-to-digital converter 156 such as the type ADC3084 obtainable in commercial quantities from the National Semiconductor Corporation is connected to the data bus 172 of the microcomputer 154. Any of eight inputs to the analog-to-digital converter (ADC) 156 are selected through a multiplexer 158 such as the type CD4051B according to an address supplied by the microcomputer via port 1 to the multiplexer 158. These inputs include peak detectors 160 and 162 for phase and ground current values, an averaging circuit 164 for average phase current, a pair of multiplexers 166 and 168 for reading panel switches and potentiometers addressed and selected by the microcomputer via port 2, and four lines from a Style Number Designator circuit 170. The designator circuit 170 allows manufacturing personnel to provide the microcomputer 154 with information concerning the optional features and modes, such as ground fault detection and serial I/O capability, with which the specific trip unit will be supplied. Use of such a designator circuit allows a single microcomputer configuration to be provided for a plurality of different models of the trip unit 26.

Also connected to the microcomputer data bus 172 is an external read-only memory (ROM) 151 and a data input/output system 174 which allows the trip unit to interact with other components and circuit breakers of the electrical distribution system. Power for the data input/output system is provided by a separate power supply 176 derived from the five-volt bus of the power supply 144. As will be more completely described in a later section, the data input/output power supply 176 is a pulse-type power supply activated by a line 178 connected to port 1 of the microcomputer 154.

Input to the microcomputer 154 from the limit value potentiometers and switches of the trip unit panel, shown in FIG. 2, is supplied through multiplexers 166 and 168 to multiplexer 158. Output information to the panel display system 155 including the LED's 84–100 and numeric display indicators 80 and 82 is supplied from the microprocessor 154 through port 2. Port 2 also supplies address and SELECT information to the multiplexers 166 and 168.

Port 1 of the microcomputer 154 provides a plurality of functions. Control of the ADC 156 is provided by a line 180 from port 1 to a switching transistor 182 which varies the reference voltage supplied to the ADC. Input to the ADC 156 from the multiplexer 158 is controlled through a line 184 from port 1 to a switching transistor 186 to selectively ground the multiplexer output to the ADC 156 under control of the program of the microcomputer 154 as will be described hereinafter. Grounding of the multiplexer 158 output while either of the peak detectors 160 and 162 are selected causes a reset of the peak detectors.

Address information allowing the multiplexer 158 to select from its various input sources 160, 162, 164, 166, 168 or 170 is provided from port 1 of the microcomputer through address lines 188.

Control of the trip coil 22 is provided from the microcomputer 154 through port 1 and a TRIP line 190. Thus, when it is determined that a tripping operation is called for, the microcomputer 154 sends, through port 1, a signal on the trip line 190 causing the switching transistor 192 to energize the trip coil 22, activate the mechanism 20, and separate the contacts 18.

3. Operational Modes

Mode 1: Low Power

This mode is performed under conditions of very low current flow through the breaker (less than 25% PU of frame rating), when external power is not being supplied to the trip unit. Under these conditions sufficient operating power cannot be continuously supplied to the trip unit, and some of its normal functions cannot be reliably performed. Therefore, the power supply generates a pulse of operating power to the trip unit circuitry sufficient to execute the normal operating cycle of the trip unit but to display only the present phase current through the breaker on the numeric display 80. This value is flashed by the display at a rate which increases as load current increases. At load current values above 25% of frame rating, Mode 2 operation is performed. Fractions of rating values will hereinafter be indicated by per unit notation; e.g. 25% = 0.25 PU.

Mode 2: Normal

This mode of operation is performed when load current is greater than 0.25 PU of frame rating but less than 1.0 PU of the rating plug value, or when external power is being supplied to the trip unit.

Figure 14:
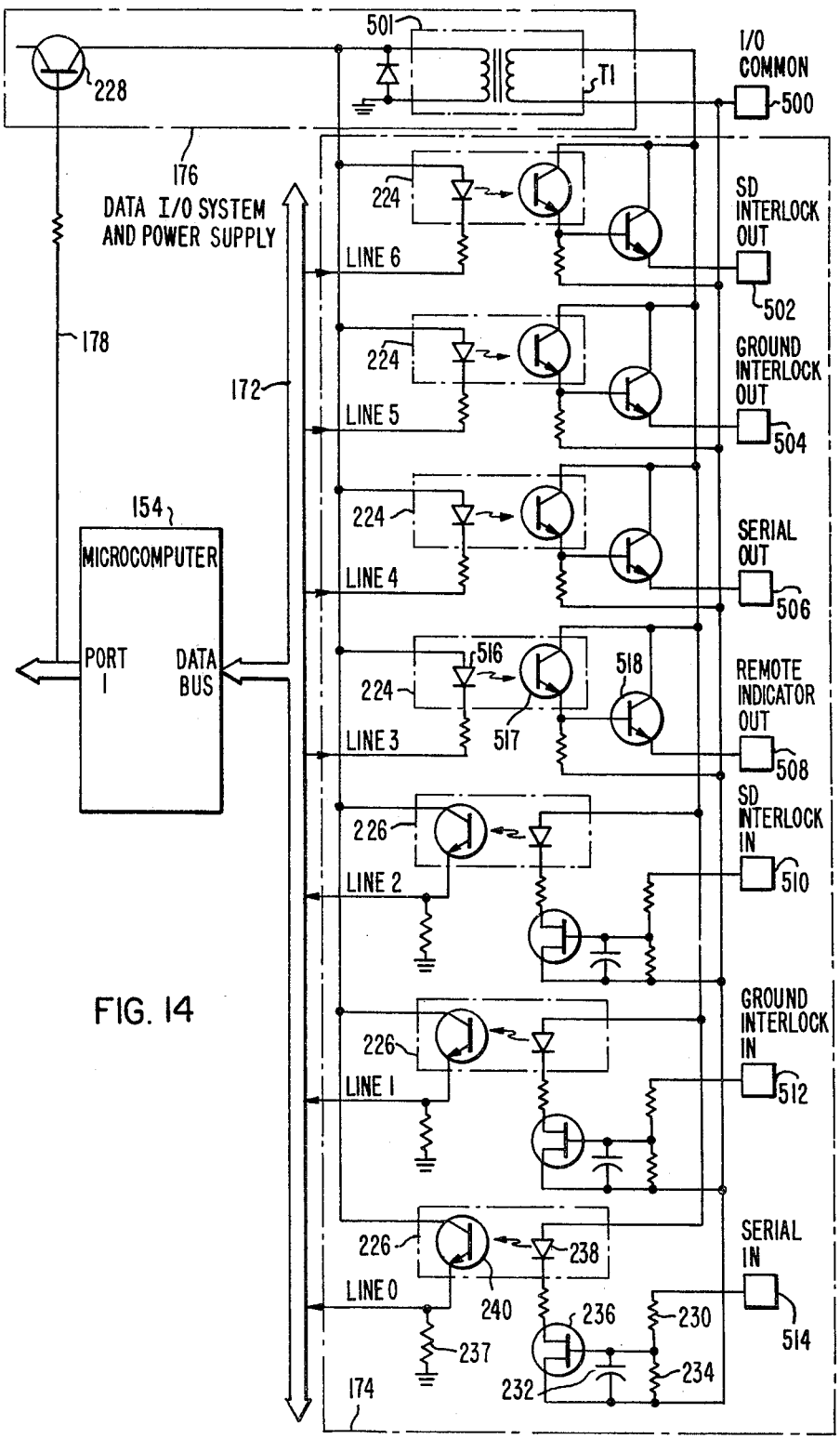
FIG. 14 is a schematic diagram of the Data Input Output System and Power Supply of FIG. 2.

As can be seen in FIG. 5, the trip unit panel contains a number of adjustment potentiometers, light-emitting diode indicators (LED's), pushbutton switches, and two-position switches. The panel also includes a pair of numeric display indicators 80 and 82. The electronic circuitry internal to the trip unit causes the numeric display indicators 80 and 82 to sequentially display the present value of electrical conditions on the circuit being protected and the various limit settings defining the time-current trip curve of the breaker as currently set. The LED's, when lighted, indicate by the legends associated with each indicator, what value is being displayed at any time by the numeric displays 80 and 82. If so desired, the numeric values displayed on the numeric indicators 80 and 82 may also be sent to a remote location via the SERIAL OUT terminal of the Data I/O System 174 (FIG. 14).

Beginning at the top of the trip unit panel as shown in FIG. 5, the LED indicator 84 is labeled PHASE CURRENT on the left and GROUND CURRENT on the right. When this LED is lighted, it indicates that the present per unit value of current flowing in the three-phase circuit being protected is displayed in the left-hand numeric display indicator 80, and the present per unit value of ground current on the circuit being protected is indicated in the right-hand digital display indicator 82. In a similar manner, the LED 86 is labeled PEAK KW SETTING and PEAK KW SINCE LAST RESET. When this LED is lighted, the value appearing in the left-hand numeric display 80 is that value of kilowatts delivered by the circuit being protected which will cause a DEMAND signal to be generated by the data input/output system. The peak value of kilowatts drawn through the breaker since the display was last reset (by the pushbutton 105 immediately to the right) is presented on the numeric display indicator 82. The LED's 88 and 90 correspondingly indicate PRESENT KW and MW×HOURS, and power factor multiplied by line voltage as follows:

PRESENT $KW$ = present phase current ×

(power factor × line voltage)

as entered by operator on front panel actual megawatt − hours = ($MW$ × HOURS) × frame rating In this manner, a user can more readily perform energy management for his system. Not only is a continuous display of present demand, peak demand, and total energy usage provided, but in addition, alarming or automatic load shedding may be initiated by the output signal provided through the data I/O system in response to the PEAK KW monitoring function.

If desired, a potential transformer could be added to the circuit breaker 10 to monitor line voltage and eliminate the need for manual operator entry of a value of line voltage. Furthermore, a high-speed A/D converter could be added to sample line voltage and phase current at a high enough rate to permit direct calculation of power factor and eliminate the need for an operator to enter the power factor.

Below the rating plug 78 in FIG. 5 can be seen a number of LED's labeled INSTANTANEOUS, LONG DELAY, SHORT DELAY, and GROUND FAULT. To the left of this series of LED's is the legend CURRENT PICK-UP and to the right is the legend TIME IN. When the LED 92 labeled INSTANTANEOUS is lighted, this indicates that the value of current which will result in an instantaneous trip is presently being displayed in the left-hand digital display indicator 80. By definition, the instantaneous trip will occur immediately, thus there is no corresponding time to be displayed, and the display 82 is blank. When the LED 94 labeled LONG DELAY is lighted, this indicates that the left-hand numeric display indicator 80 is presently showing the current value at which a long-delay tripping operation will be initiated, while the right-hand numeric display indicator 82 is showing the time parameter in seconds of a long delay tripping operation. These time and current values correspond to the long delay tripping operation discussed above with regard to the time-current tripping curve of the circuit breaker.

When the LED 96 labeled SHORT DELAY is lighted, the left-hand numeric display indicator 80 is showing the current value which will cause a short delay tripping operation to be initiated, while the right-hand numeric display indicator 82 is showing the duration, in cycles, of a short delay tripping operation. Similarly, when the LED 98 labeled GROUND FAULT is lighted, the left-hand numeric display 80 will show the value of ground current which will cause a ground fault tripping operation and the right-hand digital display 82 will show the number of cycles between the detection of the ground fault current and the command to cause the circuit breaker to trip.

As can be seen in FIG. 5, some of the legends have a solid circular symbol associated therewith, while other legends are associated with a solid square symbol. The circular symbols indicate that the parameter designated by the associated legend will be displayed as a per unit multiple of frame rating. Similarly, those parameters associated with a square symbol will be displayed as per unit multiples of plug rating. For example, assume the displays 80 and 82 were presenting values of 0.61 and 0.003, respectively, and the LED indicator 84 is lighted. This represents a present phase current of 976 amperes (0.61×frame rating=0.61×1600 amps=976) and a present ground current of 3.6 amperes (0.003×plug rating=0.003×1200 amps=3.6 amps).

A pair of miniature switches 102 and 104 labeled $I^2T$ RESPONSE are used to vary the shape of the time-current tripping curve in the short delay and ground fault areas, respectively. When the switches 102 and 104 are in the lower position, this indicates the Ground Fault and Short Delay portions of the curve will not exhibit an $I^2T$ slope, but will instead be horizontal. When the switches 102 and 104 are in the upper position, the $I^2T$ characteristic will be employed, and the characteristic for the Short Delay tripping operation will have the shape as shown in FIG. 4.

A potential transformer connected to the associated circuit could be used to otain line voltage data, and rapid sampling and direct multiplication of the instantaneous values of phase current and line voltage used to calculate real power. However, the disclosed method provides a convenient and cost-effective method which avoids isolation problems associated with potential transformers.

Summarizing, in normal operation, the following operations will be calculated sequentially, with the entire calculation sequence repeated 60 times per second: peak KW, MW-HR integration, instantaneous trip, long delay trip, short delay trip, and ground fault trip.

In addition the following values will be displayed sequentially in pairs, with each display lasting 4 seconds: PRESENT PHASE CURRENT-PRESENT GROUND CURRENT, PEAK KW setting (demand)-PEAK KW SINCE RESET, PRESENT KW-MWHR, POWER FACTOR x LINE VOLTAGE, INSTANTANEOUS PICKUP-TIME, LONG DELAY PICKUP-TIME, SHORT DELAY PICK-UP-TIME, AND GROUND FAULT PICKUP-TIME.

Mode 3: Overcurrent and Trip Mode

This mode is performed when either phase current is above the Long Delay Pickup value or ground current is above the Ground Current Pickup value. Sequencing of display values and LED indication thereof continues as in Mode 2 even though the breaker is overloaded. In addition, the Long Delay Pickup LED 94 will be lighted.

If the overcurrent or ground fault condition persists, the trip unit will initiate a tripping operation according to the time-current trip characteristic loaded therein by the user. When tripping occurs, the function which initiated the trip (long delay, short delay, instantaneous, or ground fault) will be indicated on the front panel by energization of the appropriate LED 92, 94, 96, or 98. The cause-of-trip information will be sent out by the data I/O system to the remote indicator 145. In addition, the per unit phase or ground fault current that caused the trip will be displayed and frozen on the numeric display 80.

In addition to the microcomputer trip capability, the trip circuit breaker includes the thermal switches 141 as a back-up system. Should this system initiate a trip operation, the Instantaneous LED 92 will be lighted, a value of 15.93 PU current value will be displayed on the numeric display 80, and an INSTANTANEOUS signal sent by the data I/O system.

Mode 4: Parameter Adjustment

As can be seen in FIG. 5, the trip unit panel also includes a plurality of limit value potentiometers associated with the various legends on the trip unit panel. These potentiometers are provided to allow an operator to adjust the circuitry of the trip unit to vary the shape of the time-current trip curve and produce the type of tripping characteristics required by the design of the entire electrical distribution system. When an operator adjusts one of the potentiometers (for example, the INSTANTANEOUS CURRENT PICK-UP potentiometer 112) this adjustment is detected by the trip unit circuitry and the sequential display of values is interrupted. The parameter value being adjusted is immediately displayed in the corresponding numeric display indicator, and the corresponding LED indicator is lighted. For example, if it is desired to adjust the instantaneous current pick-up value, an operator inserts a screwdriver or other tool into the potentiometer 112 and begins to turn it. Immediately, the INSTANTANEOUS LED indicator 92 lights and the present value of the instantaneous current pick-up is displayed in the numeric display indicator 80. This number is in per unit format, that is, a multiplier times the frame rating, as specified by the solid round symbol. Thus, as the potentiometer 112 is rotated, the value displayed in the indicator 80 would begin to slowly increase in discrete steps from, for example, 1.00 up to the maximum allowable value as stored internally in the trip unit, which is 10.0. When the desired value is achieved, adjustment of the potentiometer is ceased and the trip unit resumes its sequential scan and display of present values and settings. In a similar manner, any of the potentiometers on the trip unit front panel may be adjusted to achieve the desired parameter setting.

In the past, adjustment of parameter values using potentiometers in conjunction with digital circuitry has presented problems. There was a tendency, for example, for each minute change in the value of a potentiometer to produce a different value which would be immediately displayed. This produced an annoyingly rapid variation of the display which rendered adjustment difficult. Furthermore, temperature variations and other minor perturbations in the circuitry would cause variation in the display and value of the potentiometer even when no adjustment was being made. In addition, failure of the potentiometer in the past would sometimes prevent the designated parameter from being read at all.

In order to avoid these problems, the present invention employs the potentiometers to select one of eight predetermined parameter values stored within ROM of the trip unit microcomputer. Thus, the potentiometer acts as a discrete multiposition switch rather than a continuously variable adjustment device. In the event of a potentiometer failure, the trip unit selects the most conservative value of the parameter associated with the malfunctioning potentiometer for use in its monitoring functions.

To add further convenience to an adjustment operation, the trip unit includes a hysteresis feature which is described in detail in Section III.C.

Parameters may also be entered by an external circuit over the SERIAL IN terminal (FIG. 14) of the data I/O system 174.

Mode 5: Test Mode

A TEST mode is also provided in the trip unit herein disclosed. By pressing either of the momentary-contact pushbutton switches 128 or 130, an overcurrent condition or groundfault condition, respectively, may be simulated. If the switch 106 is in the NO TRIP position, the fault current value to be simulated is determined by the adjustment of the potentiometer 120 while either of the switches 128 or 130 are depressed. With the switch 106 in the TRIP position, fixed values of fault current are simulated. This simulated overcurrent or groundfault condition will or will not result in actual opening of the contacts 18 of the circuit breaker, as determined by the setting of the TRIP/NO TRIP switch 106. In either case, the test is initiated upon release of the pushbuttons 128 or 130, causing the TEST MODE LED 100 to be lighted. When the delay period expires, the appropriate LED 92, 94, or 96 will light, thus indicating the successful completion of the test. If the switch 106 has been set to the TRIP position, the contacts of the circuit breaker will actually open.

Through the use of the TEST mode with the switch 106 in the NO TRIP position, an operator can check any desired point on the time-current tripping characteristic. He does this by pressing the desired test button 128 or 130, and dialing in, on the TEST potentiometer 120, any desired multiple of the maximum continuous current. He then releases the desired phase or ground fault test button 128 or 130. The trip unit will simulate a fault at that level of the multiple of maximum continuous current which was entered via TEST potentiometer 120, and will simulate a tripping operation without actually opening the contacts.

At the completion of the test, LED 92, 94, 96 or 98 will be lighted to indicate whether the breaker tripped under instantaneous, long delay, short delay, or ground fault modes. The display 80 will show the per unit current value at which the breaker tripped (which will be the same as the value entered via potentiometer 120) and display 82 will show the number of seconds or cycles (which is specified by LED's 92, 94, 96 or 98) following initiation of the test in which the breaker tripped.

During execution of a test, a determination is made as to which is larger: actual phase (or ground) current or simulated phase (or ground) current, and the larger of the two compared to the various setting values. Thus, a test can take place with no loss of protection. Furthermore, if simulated current is larger than actual current, but both are larger than Long Delay Pick-Up, a trip operation will be performed at the end of the test, regardless of the position of the TRIP/NO TRIP switch 106.

The operator can then plot the time-current value displayed to see if this point lies on the desired time-current tripping characteristic curve. Any number of points can be so tested, allowing complete verification of the tripping characteristic as entered in the trip unit.

C. Remote Indicator And Power Supply

Figure 9:
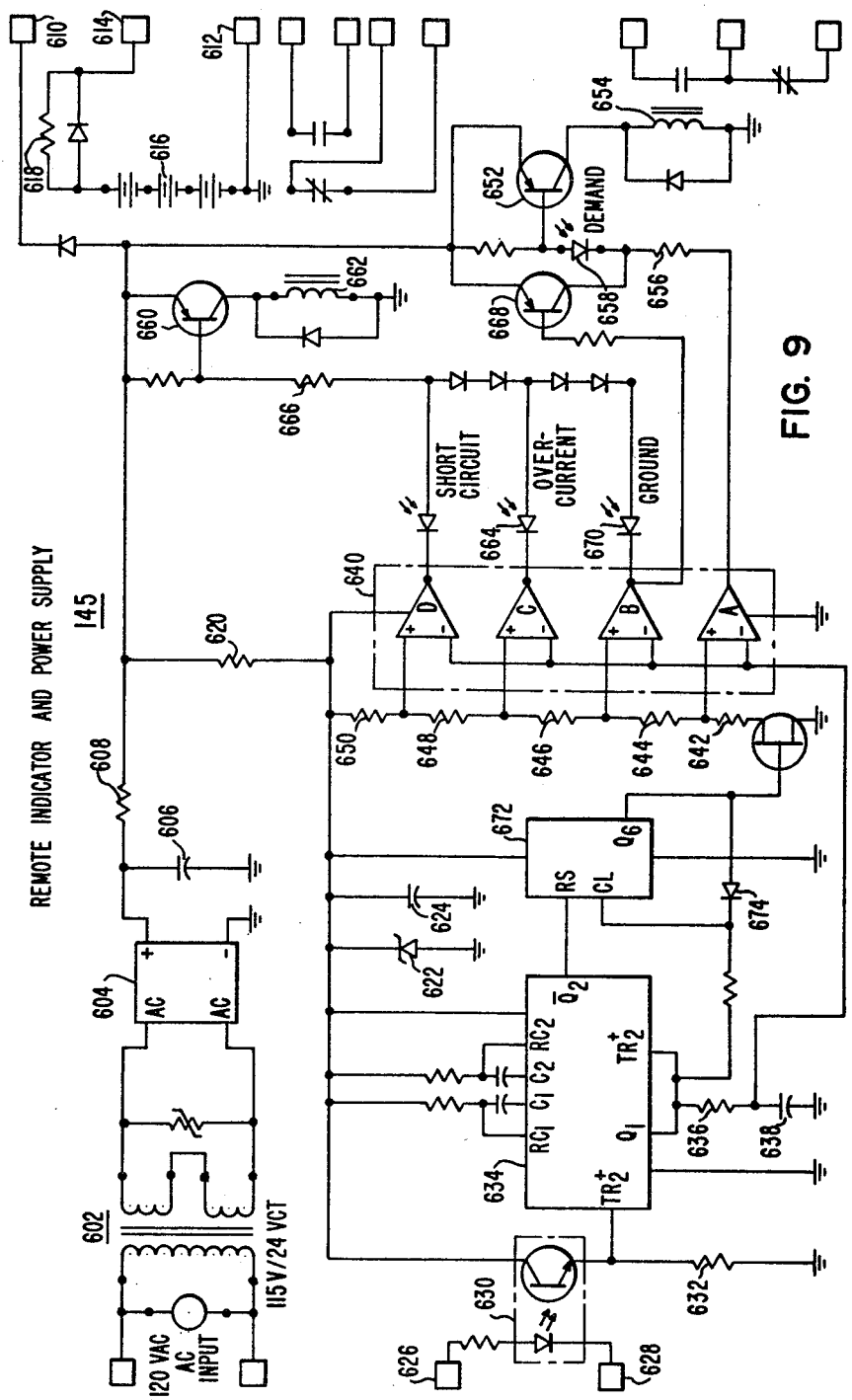
FIG. 9 is a schematic diagram of the Remote Indicator and Power Supply of FIG. 2.

A remote indicator and power supply 145 may also be connected to the trip unit 26. This device, shown schematically in FIG. 9, provides the capability of indicating at a location remote from the circuit breaker 10 when the breaker has tripped and what caused the trip. In addition, the device 145 can indicate when peak power demand has exceeded a preset limit. These indications are provided by four LED's corresponding to PEAK KW DEMAND EXCEEDED, OVERCURRENT TRIP (long delay), SHORT CIRCUIT TRIP (instantaneous, short delay, or thermal), and GROUND FAULT TRIP.

Two relays are also provided in the remote indicator 145. One relay is actuated on receipt of a peak KW demand indication, to provide the capability of automatic load shedding. The other relay is actuated on receipt of any type of trip indication to trigger an alarm bell, light, or other desired function.

The device 145 also includes a power supply energized from the AC line which provides 32 volts DC. The output of this power supply is connected to the EXTERNAL DC terminal 148 of FIG. 2.

A detailed description of the circuitry of the remote indicator and power supply is contained in Section III.E.

III. ELECTRICAL DESCRIPTION

A. Arithmetic, Logic, and Control Processor

The arithmetic, logic, and control processor 154 is a type 8048 microcomputer manufactured by the INTEL Corporation. As seen in FIG. 5A, the single 40-pin package includes the following functions: an eight-bit arithmetic logic unit 153, a control unit, a 1K×eight-bit ROM program memory 155, 64×eight-bit RAM data memory 157, an eight-bit bi-directional data bus 172, and two quasi bi-directional eight-bit ports Port 1 and Port 2. Additional control lines are also provided. A more detailed description may be obtained from the previously referenced MCS-48 Microcomputer Users Manual. Referring to the figures, and especially FIG. 2, the interconnections to the microcomputer 154 will now be described.

The eight-line data bus 172 is connected to the eight output terminals of the ADC 156. The eight-bit digital values supplied by the ADC are thus read by the microcomputer 154 by the following sequence: a pulse is sent out on the WR line of the microcomputer 154 to the ADC 156, commanding the ADC to convert the analog quantity appearing at its input terminals into an eight-bit digital quantity. Upon completion of the conversion process, the ADC 156 generates a pulse over the line connected to the T1 test terminal of the microcomputer. The microcomputer then generates a pulse on the RD line, which transfers the bit pattern produced by the ADC to the accumulator of the microcomputer 154.

The data bus 172 is also connected to the data input-/output system 174, to allow the trip unit 26 to communicate with other circuit breakers and with the remote indicator/power supply 145. The data input/output system will be more completely described in Section IIIG.

Port 1 and port 2 of the microcomputer provide the capability to communicate and control the other components of the trip unit 26. The specific connections will now be described. Line numbers correspond to the notation used in the MCS-48 Microcomputer Users Manual.

Port 1

Line 0, line 1, line 2—These lines provide the channel address information from the microcomputer 154 to the multiplexer 158, as indicated at 188 on FIG. 2.

Line 3—This line, indicated at 180 in FIG. 2, actuates the FET 182 to change the reference voltage delivered to the ADC 156, thereby increasing the resolution for the Long Delay phase current measurement.

Line 4—This line activates the transistor 192 to energize the trip coil 22 and cause the mechanism 20 to open the contacts 18 to the breaker. Line 4 is indicated at 190 in FIG. 2.

Line 5—This line actuates the FET 186 to ground the output of the multiplexer 158, which also grounds the individual input to the multiplexer 158 which happens to be selected at that time. Thus, activating line 5, (indicated at 184 in FIG. 2) can reset the peak detectors 160 and 162, when these are selected by the multiplexer 158.

Line 6—This line activates the Chip Select terminal on the external ROM when performing a read operation.

Line 7—This line, indicated at 178 in FIG. 2, periodically energizes the power supply 176 of the data input-/output system 174.

Port 2

Line 0, Line 1, Line 2, Line 3—These lines carry the data sent from the microcomputer 154 to the panel display system 155. As can be seen in FIG. 6, the digit values are supplied over these lines to the latch decoder 194 for display on the numeric indicators 80 and 82. Line 0, line 1, and line 2 (indicated as 207 in FIG. 6 and FIG. 7) also supply channel address information to multiplexers 206, 166 and 168. Line 3 (indicated as 216 in FIG. 7) is connected to the INHIBIT terminals of the multiplexers 166 and 168 and serves to toggle or selectively activate the multiplexers 166 and 168.

Line 4—This line, identified as 200 in FIG. 6, actuates the transistor 198 to light the decimal point on the numeric indicators 80 and 82.

Line 5—This line is connected to the Latch Enable terminal of the latch decoder 194 and serves to latch the data values appearing on lines 0 through 3 in the latch decoder 194.

Line 6—This line energizes the transistor 208 which, in conjunction with the output lines of the latch decoder 194 serves to energize the LED indicators 84 through 98.

Line 7—This line is connected to the INHIBIT terminal of multiplexer 206 and is indicated at 212 in FIG. 6.

The Interrupt terminal INT of the microcomputer is connected to the high voltage side of the thermal switches 141. Activation of these switches thus causes the Interrupt terminal 143 to go LO and initiate the Interrupt instructions in ROM 155 which processes the thermal trip operation, and indicates an instantaneous display trip.

B. Panel Display System

A detailed schematic diagram of the panel display system of FIG. 2 is shown in FIG. 6. As can be seen, a seven-segment latch decoder circuit 194 such as a type CD4511B is provided. A four-bit input signal is provided by lines 0-3 of port 2 of the microcomputer 154. The decoder circuit 194 provides a seven-line output signal through a load resistor array 196 to the pair of four digit seven-segment LED digital display indicators 80 and 82. An eighth line for activating the decimal point of the digital display indicators 80 and 82 is also provided through a transistor 198 which is actuated by a line 200 also connected to port 2 of the microcomputer 154. A driver circuit 202 and transistor 204 are provided under control of a multiplexer circuit 206, which may be for example, a type CD4051B. A three-bit SELECT signal, also driven by three lines 207 from port 2 of the microprocessor is supplied as input to the multiplexer circuit 206. The LED indicators 84, 86, 88, 90, 92, 94, 96, 98 and 100 are actuated through the transistor 208 by a line from port 2 of the microcomputer 154 in conjunction with the digital display indicators 80 and 82. The TEST LED 100 is also driven by the transistor 208 and an additional transistor 210 in conjunction with an INHIBIT line 212 also supplied to the multiplexer 206 from port 2 of the microcomputer.

C. Parameter Input

Figure 7:
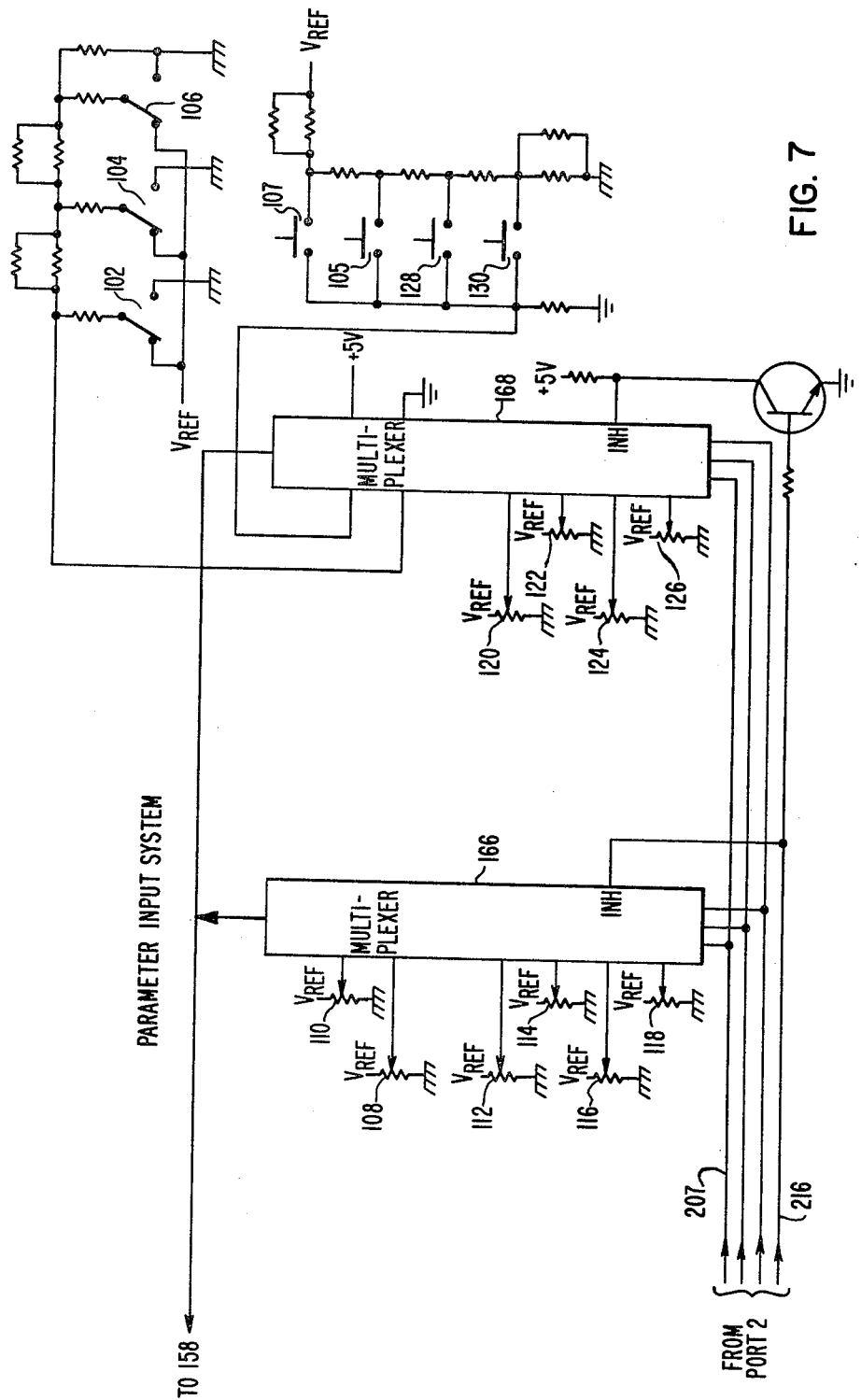
FIG. 7 is a detailed schematic diagram of the parameter input system of FIG. 2.

Limit values for the trip unit 26 are provided by the potentiometers 108-120, as shown in FIGS. 2, 5, and 7. Each of the potentiometers has one end of its resistance element connected to the $V_{REF}$ supply, and the other end of the resistance element grounded. The wiper of each potentiometer is connected to an input terminal of one of the multiplexers 166 and 168 which may be, for example, a type CD4051B. Thus, each of the potentiometers provides an analog voltage signal to its appropriate multiplexer input terminal. These input terminals are selected by a three-bit address line 207 plus an INHIBIT line 216 connected to port 2 of the microprocessor.

The two-position switches 102, 104 and 106 correspond respectively to $I^2T$ IN/OUT switches for phase current and ground current, and a TRIP/NO TRIP function for the test mode. As can be seen, these switches serve to construct a variable voltage divider between $V_{REF}$ and ground which provides any of six analog voltage values to a terminal of the multiplexer 168. In a similar manner, the pushbutton switches 107, 105, 128 and 130 corresponding respectively to DISPLAY RESET, DEMAND RESET, PHASE TEST, and GROUND TEST, serve to place any of eight analog voltage signals on another terminal of the multiplexer 168.

D. Style Number Designator

Figure 8:
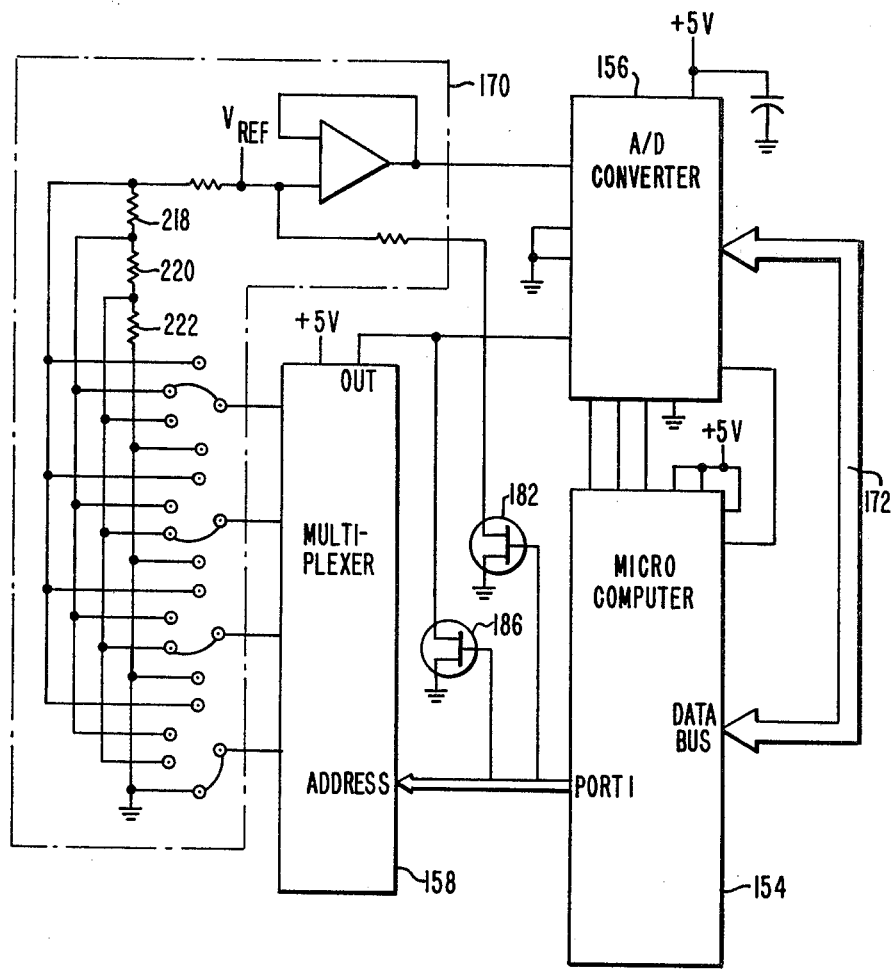
FIG. 8 is a detailed schematic diagram of the Style Number Designator System of FIG. 2.

FIG. 8 shows in detail the style number designator circuit 170 shown in FIG. 8. Each four-digit decimal style number corresponds to a particular option combination. As can be seen in FIG. 8, the style designator circuit provides input to four terminals of multiplexer 158. Each of these terminals represents one digit of the decimal style number and may be connected to any of four positions on a voltage divider formed by the resistors 218, 220, and 222 connected between ground and $V_{REF}$. These connections are selected and made by jumper connections wired at the factory to provide each of the terminals of multiplexer 158 with any of four possible analog voltage signal values. The multiplexer 158, on command, then supplies these values to the ADC 156 which converts them to the 8-bit digital code which is read by the microcomputer and interpreted as the style number, allowing the microcomputer to determine which of the many option combinations for the trip unit 26 are actually present in that particular trip unit.

E. Remote Indicator And Power Supply

The data input/output system 174 supplies pulse coded output signals, over a single optically coupled pair of wires, to the Remote Indicator 145 shown in FIG. 9 providing a remote indication that the load being supplied through the circuit breaker has exceeded a predetermined power limit. In addition, cause-of-trip indications of overcurrent, short circuit, or ground fault are provided. The circuit to be described decodes the corresponding four input signals to provide both LED indications and relay closures.

In addition, the circuit provides a remote source of power, from both the AC line and from batteries, to the power supply 144. This capability is needed in those applications which require continuous retention of data such as cause-of-trip indicators and energy functions including megawatt-hours and peak demand power.

As can be seen in FIG. 9, input power is supplied through a transformer 602, rectifier circuit 604, and filter capacitor 606 at a level of approximately 32 volts. A current limiting resistor 608 is provided to protect against accidental shorting of the output terminal 610. Terminal 610 is connected to the EXTERNAL DC INPUT 148 (FIG. 2) and terminal 612 is connected to the digital ground terminal of the trip unit 26. If a jumper is connected between terminal 610 and terminal 614, the three internal 8-volt nickel-cadmium batteries 616 can be activated to support the output voltage at 24 volts, should the AC input voltage be interrupted. A 10K "trickle charge" resistor 618 is provided for battery charging.

An 8.2 volt power supply is provided by resistor 620, Zener diode 622, and capacitor 624 for the decoding and alarm circuit.

The data I/O output terminal 508 of FIG. 14 labeled Remote Indicator Out is connected to terminal 626 of FIG. 9, and the I/O COMMON terminal 500 of FIG. 14 is connected to terminal 628 of FIG. 9. The 100 microsecond, 4 volt output pulses applied to terminals 626 and 628 produce an 8 milliampere current flow through the optical coupler 630. This current turns on the coupler transistor which produces an 8 volt pulse across resistor 632.

The microcomputer 154 can produce one 100 microsecond pulse every two milliseconds, or a maximum of eight pulses per cycle of AC power. A coding technique is used, with one pulse out of eight denoting a DEMAND alarm. If a trip has occurred, two consecutive pulses out of eight denote a ground fault trip, three consecutive pulses out of eight denote overcurrent (long delay) trip, and five consecutive pulses out of eight denote a short circuit (either instantaneous or short delay) trip condition. The pulse coding scheme is shown as waveforms A in FIG. 10.

Figure 10:
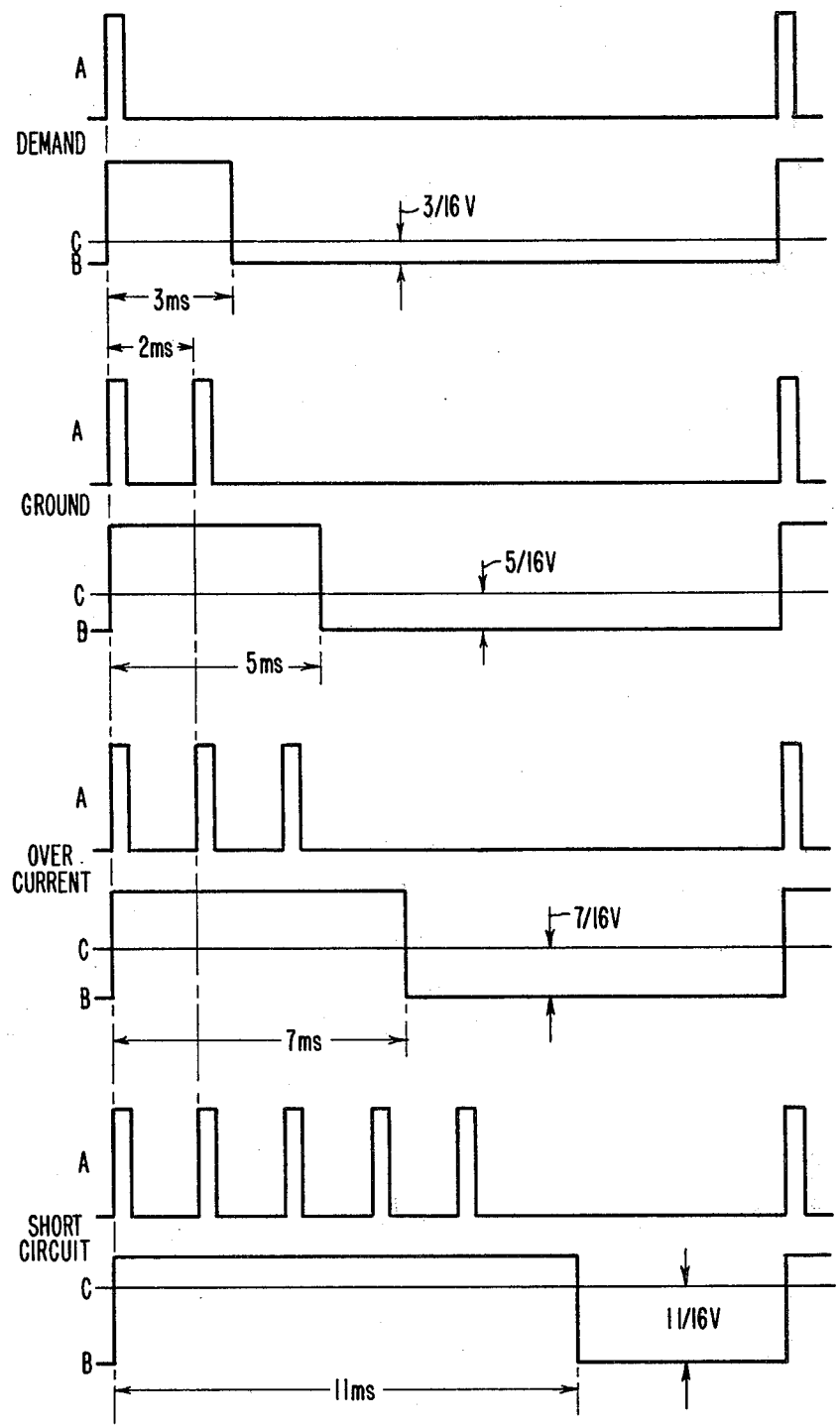
FIG. 10 is a diagram of the waveforms present at various locations in the Remote Indicator and Power Supply of FIG. 9.

The input pulses provide trigger inputs for a retriggerable 3 millisecond monostable flip-flop output Q1 of integrated circuit 634 which may be, for example, an RCA CD4098 device. The retriggerable feature means that any pulse which occurs during the 3 millisecond timing interval will cause a new 3 millisecond interval to start. Waveforms B of FIG. 10 show the resulting Q1 output for one, two, three, and four consecutive input pulses, corresponding to a DEMAND ALARM, a ground fault trip, a long delay trip, and a short circuit trip, respectively. The amplitude of the Q1 pulses is equal to the supply voltage supplied to the integrated circuit 634. When the Q1 output is averaged by resistor 636 and capacitors 638, a DC voltage C is produced whose value is the following fraction of the supply voltage: either 3/16 volts, 5/16 volts, 7/16 volts, or 11/16 volts, respectively. This value is fed to the inverting input terminals of quad comparator 640 which compare the filtered value C to fixed fractions of the supply voltage of ⅛ volts, ¼ volts, ⅜ volts, and 9/16 volts, which are developed by the divider network including resistors 642, 644, 646, 648, and 650. The comparator then provides outputs which indicate which of four possible pulse patterns were applied at input terminals 626 and 628. If, for example, a DEMAND condition exists, producing a pulse pattern of one out of eight pulses, the DC voltage at the inverting terminal of comparator A of 640 will be 3/16 of the supply volts, which is greater than ⅛ of the supply volts but smaller than ¼ of the supply volts. As a result, the output terminal of comparator A will be LO while other inputs will be HIGH. Transistor 652 and relay 654 will be turned on by current flow through resistor 656 which also lights the demand LED 658.

An overcurrent trip condition will cause three consecutive pulses to appear at the input terminals 626 and 628, and an averaged value of 7/16 of the supply voltage will appear at the inverting terminals of the comparators of 640. This value is greater than ⅜ of the supply volts but less than ⅔ of the supply volts. In this case, the output terminals of comparators A, B, and C will be LO. Transistor 660 and relay 662 will be on, because of current flow through the overcurrent LED 664 and resistor 666. Transistor 652 and the DEMAND LED will be off because of the shorting effect of transistor 668. The GROUND LED 670 is also off because of the shorting effect of the OVERCURRENT LED 664. In this way, the highest level comparison always dominates. A function of integrated circuit 672 (which may be, for example, an RCA type CD040) and Q1 is to provide a ½ second ON delay for the comparators, which is required to allow the voltage on capacitor 638 to stabilize. The Q1 pulses occur every 1/60 seconds. These are counted by counter 672 until thirty-two pulses occur and output Q6 goes HIGH. At this time, output Q1 is turned on, and additional pulse inputs are inhibited by diode 674.

Approximately 30 milliseconds after the last pulse is received by optical isolator 630, the Q2 terminal of the retriggerable monostable flip-flop 634 will go HIGH. This resets the output Q6 of 672 and turns Q1 off. The function of counter 672 and Q1 is to provide positive on/off operation of the LED indicators and the ALARM/LOCK-OUT and DEMAND RELAYS 662 and 654.

F. Data Input/Output System and Associated Power Supply

As hereinbefore explained, it is contemplated that a circuit breaker employing the principles of the present invention will be employed in an electrical distribution system in coordination with a number of other circuit breakers. It is sometimes desired that various commands and information be sent from this circuit breaker and that various parameters sent by other associated breakers be sensed by this breaker. This information is used to construct the desired interlocking scheme as specified by the system architect or designer.

The Data I/O System, shown in detail in FIG. 14, includes four output lines: Short Delay Interlock Out 502, Ground Interlock Out 504, Serial Out 506, and Remote Indicator Out 508.

Three input terminals are also provided: Short Delay Interlock In 510, Ground Interlock In 512, and Serial In 514. The Serial Out and Serial In terminals are used to communicate digital data between the microcomputer 154 and a remote digital circuit. The Remote Indicator Out terminal provides a one-of-four coded pulse output for cause-of-trip indication (overcurrent, short circuit, or ground), and peak power demand alarm indication to the Remote Indicator, as described in Section III F. The input and output interlock terminals allow direct interlock connections between breakers without any additional components.

If typical optical coupling circuitry were used, 400 milliwatts of power would be required (12 milliamperes at 5 VDC for each of seven lines). The power which the current transformers 24 are capable of supplying is only about 500 milliwatts (100 milliamperes at 5 VDC), most of which is required by the microcomputer 154. Conventional optical coupling circuitry thus cannot be used.

The power supply for the data input/output system 174 includes a pulse transformer 501 connected through a transistor 228 to line 7 of port 1, indicated as 178 in FIGS. 2 and 14. The microcomputer provides a 100 microsecond pulse every 2000 microseconds, as commanded in the common display subroutine, thereby reducing the power supply requirement of the data input/output system 174 by a factor of nearly 20 to 1, or about 20 milliwatts (4 milliamperes average at 5 VDC). This is small enough to be easily supplied from the power supply 144.

Figure 15:
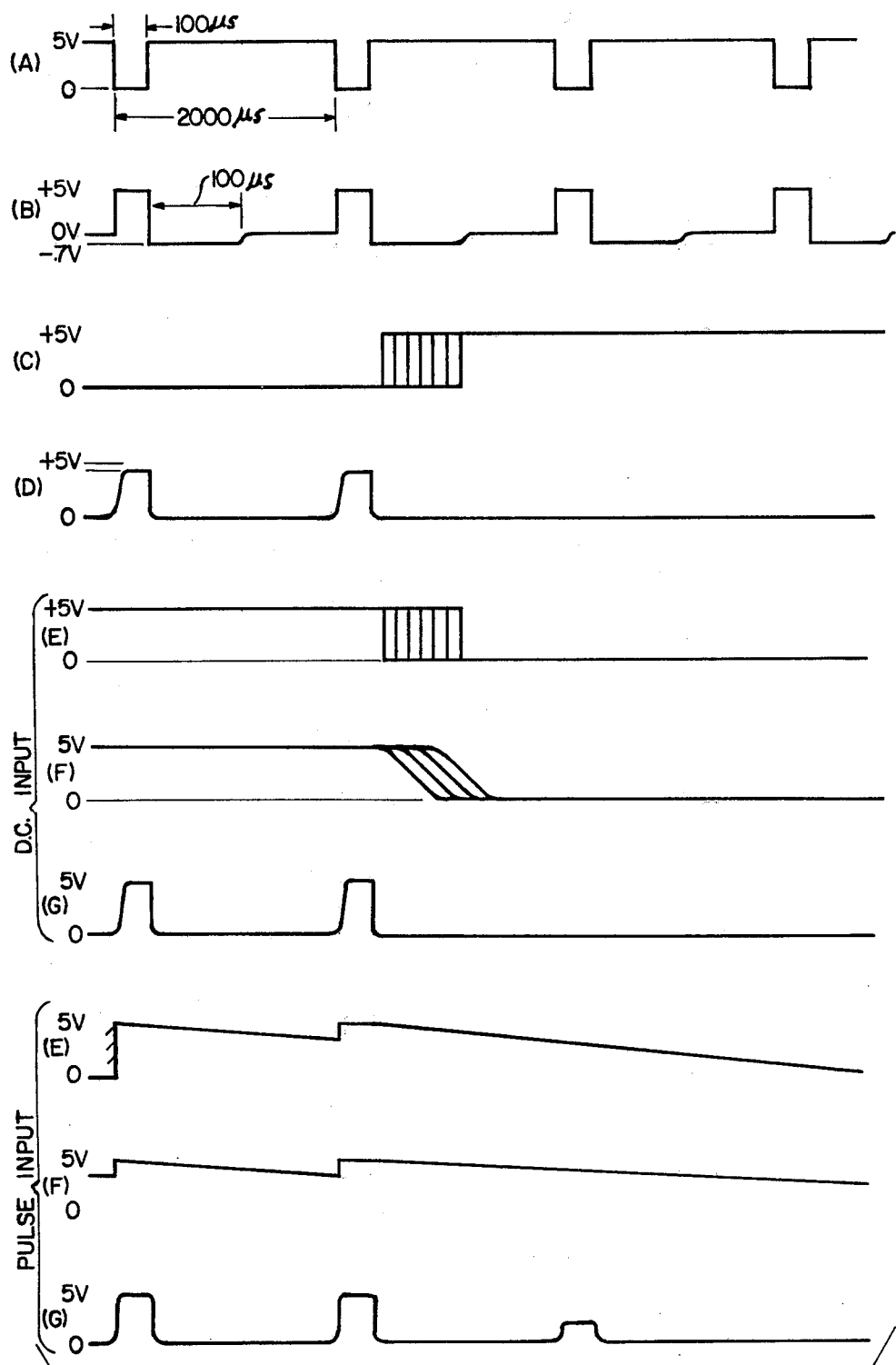
FIG. 15 is a diagram of the waveforms present at various locations in the system of FIG. 14.

The waveforms appearing in the power supply 176 are shown in FIG. 15. Waveform A is that generated on line 7 of port 1 by the microcomputer 154. For approximately 100 microseconds out of about every 2000 microseconds (actually $\frac{1}{8} \times 1/60$ seconds) line 7 of port 1 is held low at microcomputer circuit ground. This turns on transistor 228, thereby applying +5 volts to the input of transformer 501, as seen in waveform B of FIG. 15. A corresponding waveform is produced on the output terminal of transformer 501 relative to the system common terminal of the data input/output system 174.

If an output is desired from, for example, the Remote Indicator Out terminal 508, the corresponding microcomputer output line, line 3 of the data bus 172 is held at circuit ground, as shown in waveform C in FIG. 15. LED 516 is turned on by current flow through transistor 228. The phototransistor 517 then turns transistor 518 on, producing output voltage waveform D. If line 178 (waveform C) is HIGH, then the corresponding output from transistor 518 is zero, as shown by waveform D.

The input circuitry is designed to work with both a directly coupled DC signal from an older circuit breaker, or a pulse input such as that previously described in this section. An input signal at, for example, the Serial Input terminal 514 as shown in waveform E, will also appear at the gate of FET 236, as shown in waveform F. When the pulse voltage appears at the output of pulse transformer 501, circuit will flow in LED 238, and then through FET 236 which has been turned on by the input signal at the Serial Input terminal 514. The FET 236 has a turn-on gate voltage of 2.5 volts and internal gate-to-source 15 volt Zener diode protection. This range is required to meet the 4 volt pulse input provided by a microcomputer type circuit and a 12 volt DC signal provided by the older type of solid state trip unit.

FET 236 provides two functions. First, it provides a memory element when the input signal is a pulse. It does this in connection with the capacitor 232 which is charged through resistor 230 by the 100 microsecond input pulse. The values of capacitor 232 and resistor 230 are chosen so as to give a 15 microsecond time constant. Capacitor 232 discharges through resistor 234, sized to give a 10 millisecond time constant. The capacitor 232 cannot discharge through 230, since the input signal is provided by the emitter of an NPN transistor. Thus, the gate of transistor 236 is held high as long as input pulses occur every two milliseconds. Approximately 10 milliseconds after the input pulses disappear, transistor 236 will be turned off.

The second purpose of transistor 236 is current gain. The optical coupler 226 requires nearly 10 milliamperes to turn the associated phototransistor on. This current is provided by transistor 236. The high DC input impedance at the input terminal is required, since the older trip unit control circuits can provide only a small DC input current.

The presence or lack of an input signal on terminal 514 is read by the microcomputer at line 0 of the data bus, waveform G, which is high during the 100 microsecond pulse period if, and only if, an input signal is present at the terminal 514. A pull-down resistor 237 is provided to maintain the data bus lines connected to the data input terminals at circuit ground when no input signal is present at the terminal 514. In this manner, a signal from a circuit breaker, emergency power generator, or other associated component of the electrical power distribution system can be sensed by the microcomputer 154 and the circuit breaker 10 can be commanded to perform appropriate action. Furthermore, parameter values can also be supplied, through the SERIAL IN terminal 514, from a remote location. Appropriate instructions in ROM then decode the incoming information and store it in RAM for use by the limit checking functions.

G. System Power Supply

1. Block Diagram Description

The power supply 144 of FIG. 2 is shown in block diagram form in FIG. 11. It can be powered by one of four sources: external AC or DC voltage, the Remote Indicator 145 of FIG. 2, current input from a ground current detection transformer 28, or current input from the three phase current measuring transformers 24.

The rectified output of the external AC source is compared to the DC voltage from the Remote Indicator and the largest instantaneous value is supplied by the auctioneer circuit 702 to the power supply's energy storage capacitor 704 for use by the DC-to-DC converter 706 and the trip coil 22. A voltage sensing circuit 708 monitors the output of the voltage auctioneering circuit 702. Whenever this voltage is greater than 22 VDC the DC-to-DC converter 706 is turned ON. A "crowbar" current switch 710 is thrown to position (2)

when the voltage exceeds 24 VDC. The converter 706 provides the 5 VDC supply (at 100 mA) for the microcomputer circuit, a reference voltage $V_{REF}$ (1.64 VDC) and a power ON reset control signal RS.

The unit can also be powered by either the rectified output of the ground current transformer or the current auctioneered, rectified output, of the three phase current transformers 24. The two currents are summed at 712 and fed to the "crowbar" 710 which passes the current either into the energy storage capacitor 704 or a current bypass 714. Current flows into the capacitor 704 until the capacitor voltage reaches about 39 VDC, at which point the "crowbar" 710 transfers the current to the by-pass circuit 714. Current by-passing continues until the voltage on the capacitor 704 drops to about 34 VDC and the switch 710 again causes the current to flow into the capacitor.

2. Circuit Description

The power supply 144 is shown in greater detail in FIG. 12. The external AC input is rectified by BR201 and compared to the external DC input. The result is fed through D101 to energy storage capacitors C105 and C112. The sensed voltage is also fed to the crowbar circuit formed by the power field effect transistor 0101 and gates A and B (connected as inverters) of quad NAND circuit IC101. The quad NAND circuit is powered by current flow through R103, D107, D108 and D109, which produces a temperature stabilized voltage of about 10 VDC for pin 14 of IC101D. The quad NAND has input hysteresis which causes the output to go LOW when the inputs exceed about 70% of the supply voltage (7 VDC). The output then stays low until the inputs drop to 30% of the supply voltage (3 VDC). Thus the crowbar is turned ON when 7 VDC appears across R105 which corresponds to 24 VDC at the external DC input (7 VDC plus drop across R104, R102, and D103). It will be noted that the crowbar can also be turned ON if the voltage across the energy storage capacitor 704 exceeds 39 VDC.

If external power is available, then the on-off status of the converter 706 is controlled by the external power supply voltage, rather than the storage capacitor voltage.

The 24 VDC switching point for the external DC input corresponds to the minimum DC voltage required for the trip coil 22 to operate. The 39 VDC limit on the voltage across the energy storage capacitor is a compromise between the 50 VDC maximum limit of the capacitor and the 30 VDC minimum input to the converter required to produce 5 VDC output at 100 mA DC with a minimum current transformer output 32 mA RMS.

Current shunts R100 and R101 are used to sense phase and ground current respectively. It will be noted that current flow through the resistors is through either Q101 (crowbar ON) or C105 and C112 (crowbar OFF) and IC102.

The required 15 millisecond turn-off delay of the +5 VDC supply is achieved by means of diode D110, resistor R107, and capacitor C102. When the voltage at pins 8 and 9 of IC101 drops below 3 VDC the output pin 10 goes high. A 15 millisecond delay exists before pin 12 and 13 reaches 7 VDC. At this time pin 15 goes low causing the +5 VDC reference to go to zero.

The voltage sensor 708 also provides an ON/OFF control to the DC-to-DC converter 706. The converter 706 is turned ON when the capacitor voltage reaches 37 VDC and OFF when it drops to 33 VDC. A 15 millisecond delay in the OFF signal is used to insure that the microcomputer 154 is ON long enough to display the present value of phase and ground current, even when the output current from transformers 24 is too small to maintain the operation of converter 706, and to ensure the maintenance of a TRIP signal long enough to effect generation of the trip coil 22. Note that the trip coil is controlled by nonlatching FET 192, rather than a latching device such as the SCR's used in the prior art. This provides immunity from nuisance trips due to electrical transients, and prevents undue drain on the power supply when operating power is supplied by a battery.

Figure 13:
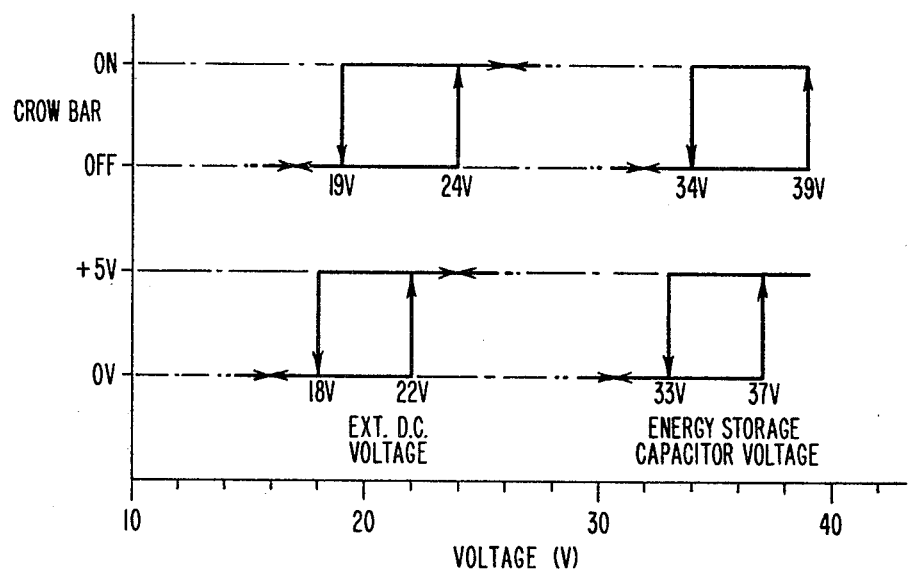
FIG. 13 is a diagram of the switching levels occurring at various locations in the System Power Supply of FIGS. 11 and 12.

The switching points of the ON/OFF control 708 and crow bar 710 are shown in FIG. 13.

The converter 706 is a chopper type consisting of PNP darlington switching transistor IC102, inductor L101, "free wheeling" diode D112, and a voltage feedback reference formed by transistors Q103 and Q104. The voltage at the base of Q103 is adjusted to be +5 VDC by means of R109. This voltage is approximately ½ the temperature stabilized +10 VDC produced by D107, D108 and D109.

The circuit operates as follows. If the output voltage is below +5 VDC, Q103 will be ON and Q104 OFF. The collector current of Q103 is the base current for the PNP darlington transistor IC102 which is then turned ON. With approximately +35 VDC applied to L101 the current will rise linearly. The current will flow into C106 and the connected load. When the output voltage exceeds +5 VDC, Q103 will be turned OFF and Q104 will be turned ON. The collector current of Q104 turns on Q102 which clamps the base of IC102 causing it to be turned OFF rapidly. At this time, the current in L101 will switch from IC102 to diode D112. The output voltage will begin to decrease until Q103 turns ON, Q104 turns OFF, and the process repeats itself. Hysteresis in the ON/OFF switching results from natural over and under shoot associated with the L101 and C106 resonant network. Positive switching feedback is provided by C103 and R110. The switching points of the power supply 144 are shown in FIG. 13.

In addition to the +5 VDC level, the power supply 144 also provides a reference voltage $V_{REF}$ which is used by the microcomputer 154. An additional signal, a power-on reset signal for the microcomputer is provided by IC103 in combination R114, R115, R116 and C106. When the converter turns ON and +5 VDC is produced, the RS line remains at circuit ground for about 5 milliseconds. This signal is applied to the microprocessor which is then reset. Diode D111 provides an immediate power-down reset as soon as the 5 VDC reference goes to zero, thereby assuring both a safe power-up and power-down transition.

H. Read-Only Memory

The internal microcomputer ROM 155 is supplied with instructions defining a series of eight major functions which are executed every cycle of AC current, that is, every 16.667 milliseconds. Each function is responsible for retrieving one or more parameter values from outside the microcomputer. These parameters include values obtained from the electrical circuit being protected, such as phase current and ground current, as well as values specified by the front panel potentiometers and switches. The function then loads the parameter value into a specified location in RAM. In addition, most of the functions are also responsible for performing one or more limit checks; for example, comparing present phase current to the instantaneous trip pick-up value. Since the entire loop of eight functions is executed every 16.67 milliseconds, each of the limit checks is performed at that rate.

In addition to the scanning and limit check duties, each function is responsible for two operations relating to the front panel numeric displays 80 and 82. Every four seconds, one function reads a display parameter value from its assigned location in RAM. It then formats this parameter value into four digit values. For example, if the present phase current is equal to 2.14 per unit, the appropriate function would produce four digit values: a blank, a two, a one, and a four. These digit values would then be placed into assigned locations in RAM, each location corresponding to one digit of the numeric display indicator 80. Generally, each function will so format two parameter values, thus loading a total of eight digit values into corresponding RAM locations. These digit values remain in RAM for four seconds until the next function performs its digit value loading duty.

At this point, the digit values are residing in RAM; they must now be sent to the appropriate digit of the numeric displays 80 and 82, the second operation performed by the eight main functions. Each function is responsible, at each time it is executed, for retrieving one of the digit values from RAM and sending this digit value out on port 2 of the microcomputer 154 to the numeric displays 80 or 82. The digit value then appears lighted in its appropriate location in the numeric displays. Since a new function is executed approximately every 2 milliseconds (16.667/8 ms), the digit value will appear for this length of time on the numeric display before it is extinguished and the next digit value sent to a different digit location on the numeric display. At any given time, therefore, only one digit out of eight is lighted on the numeric displays 80 and 82. However, the digits flash so rapidly that they appear to an observer to be simultaneously lighted.

The external ROM 151 is optional and may be used to store instructions to implement additional features such as other functions related to the data I/O system. Also, the look-up table for potentiometer settings may be stored in external ROM to facilitate changes in the table values.

Figure 17:
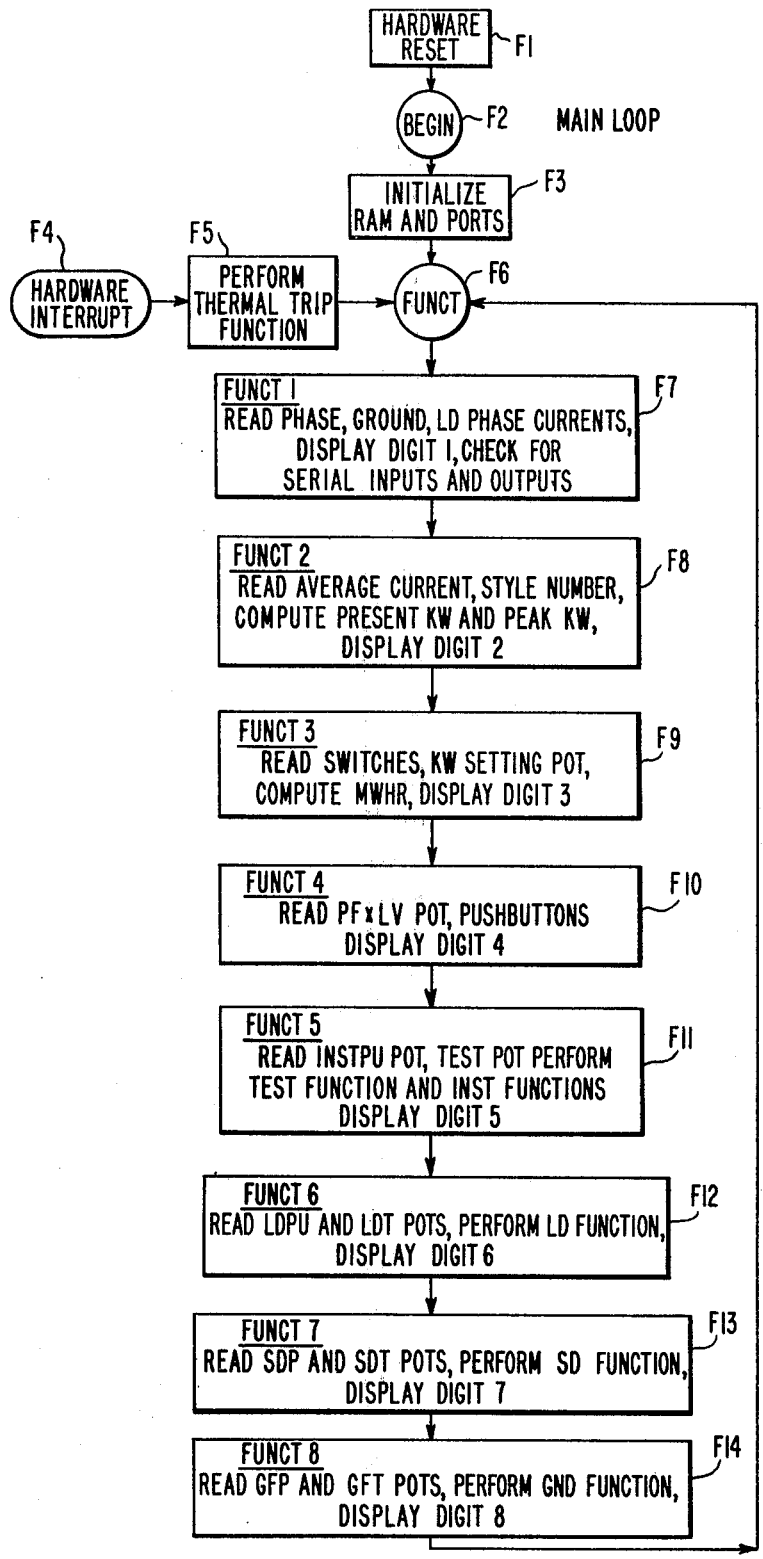
FIG. 17 is a flowchart of the main instruction loop stored in read-only memory of the microcomputer shown in FIG. 2.
Figure 18:
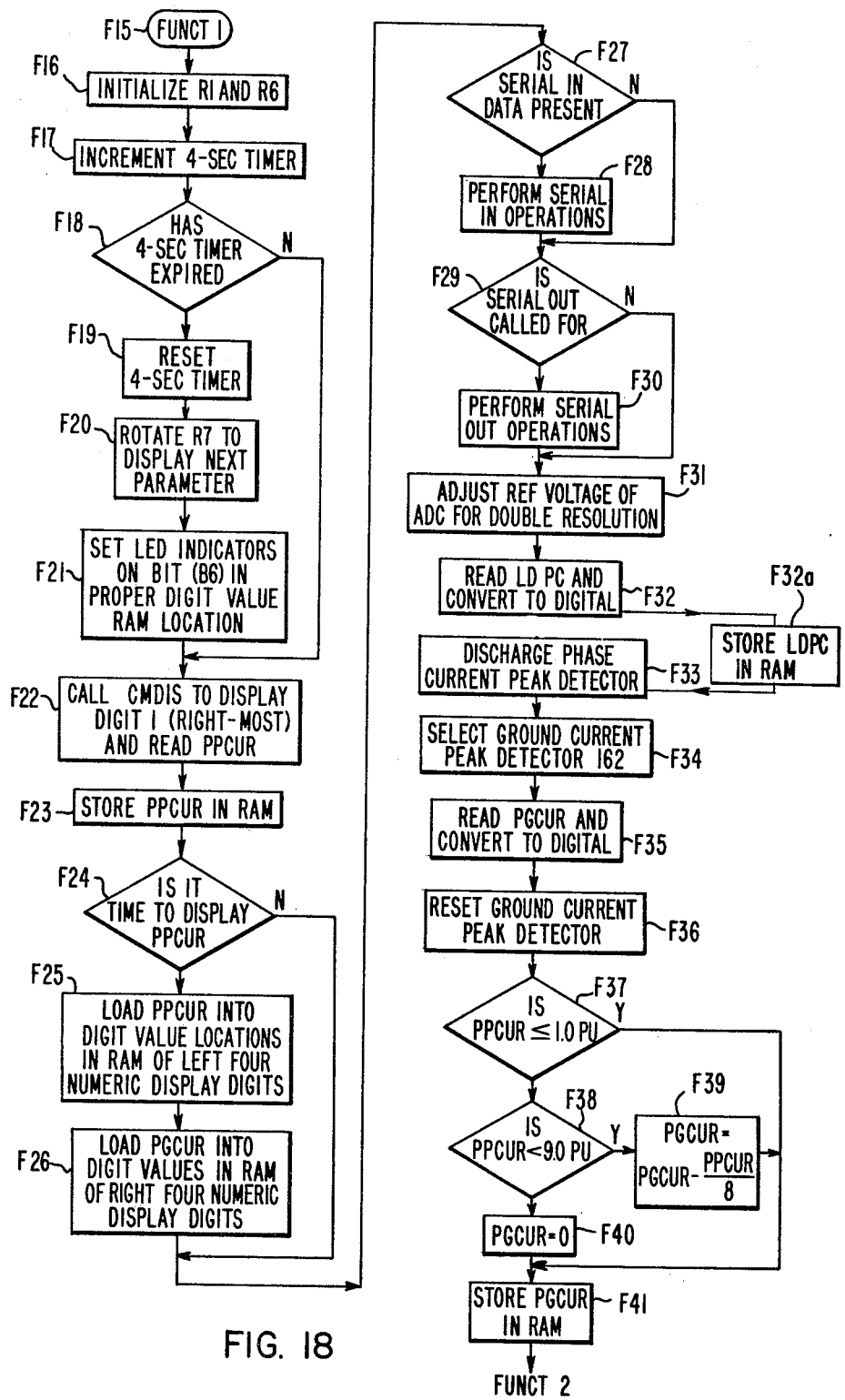
FIG. 18 is a flowchart of the first function of the main instruction loop shown in FIG. 17.
Figure 19:
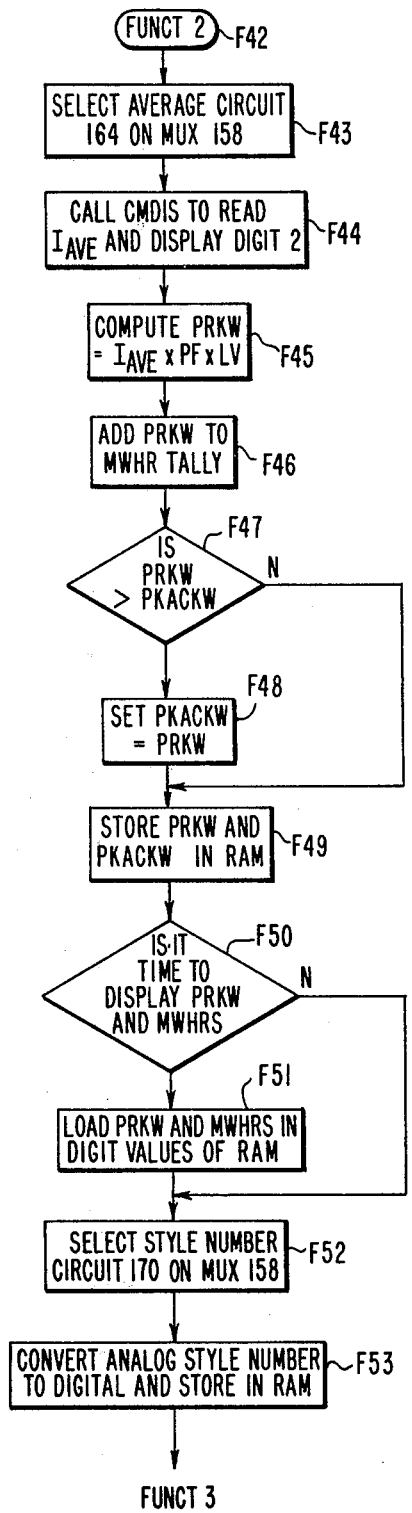
FIG. 19 is a flowchart of the second function of the main instruction loop shown in FIG. 17.
Figure 20:
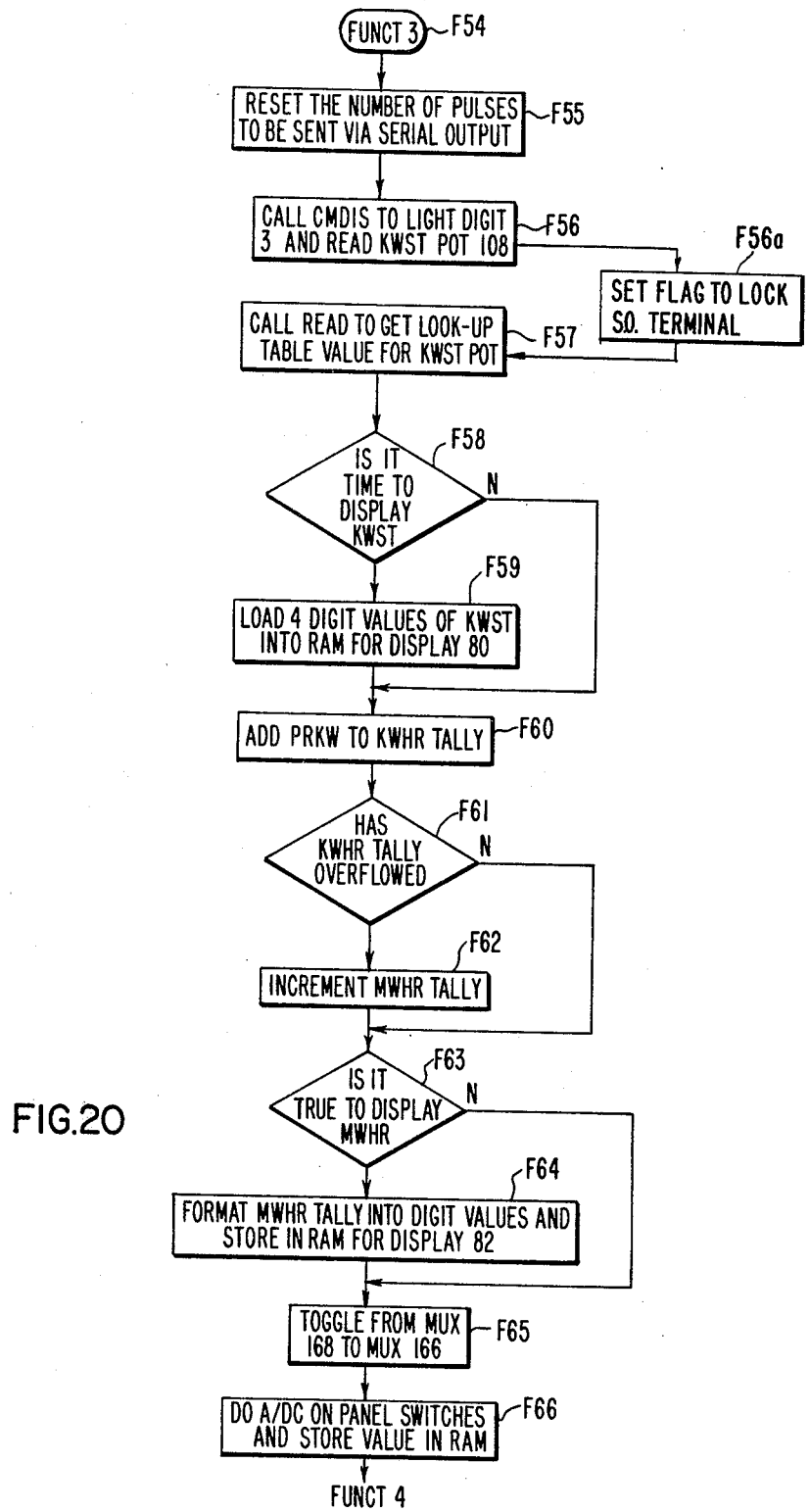
FIG. 20 is a flowchart of the third function of the main instruction loop shown in FIG. 17.
Figure 21:
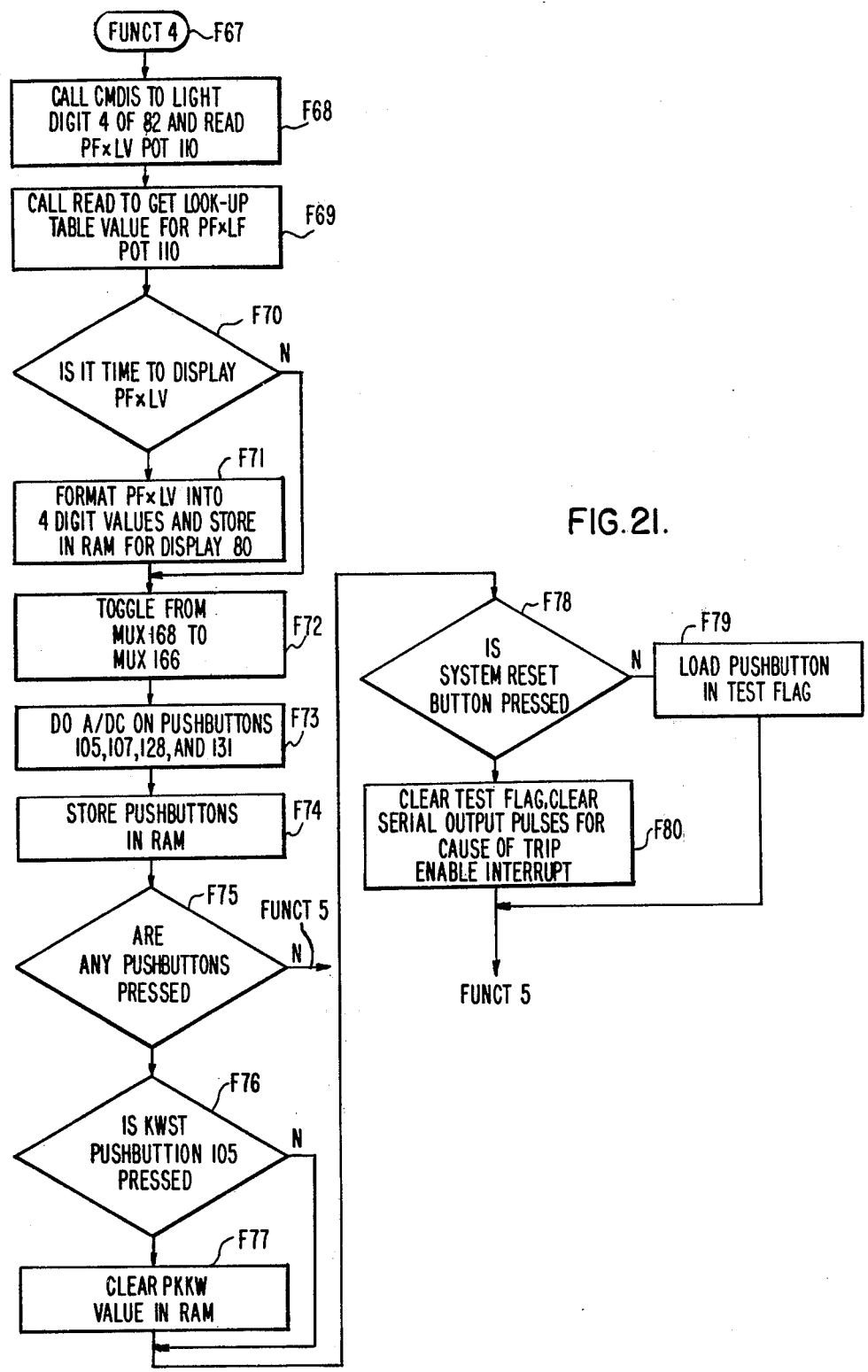
FIG. 21 is a flowchart of the fourth function of the main instruction loop shown in FIG. 17.
Figure 22:
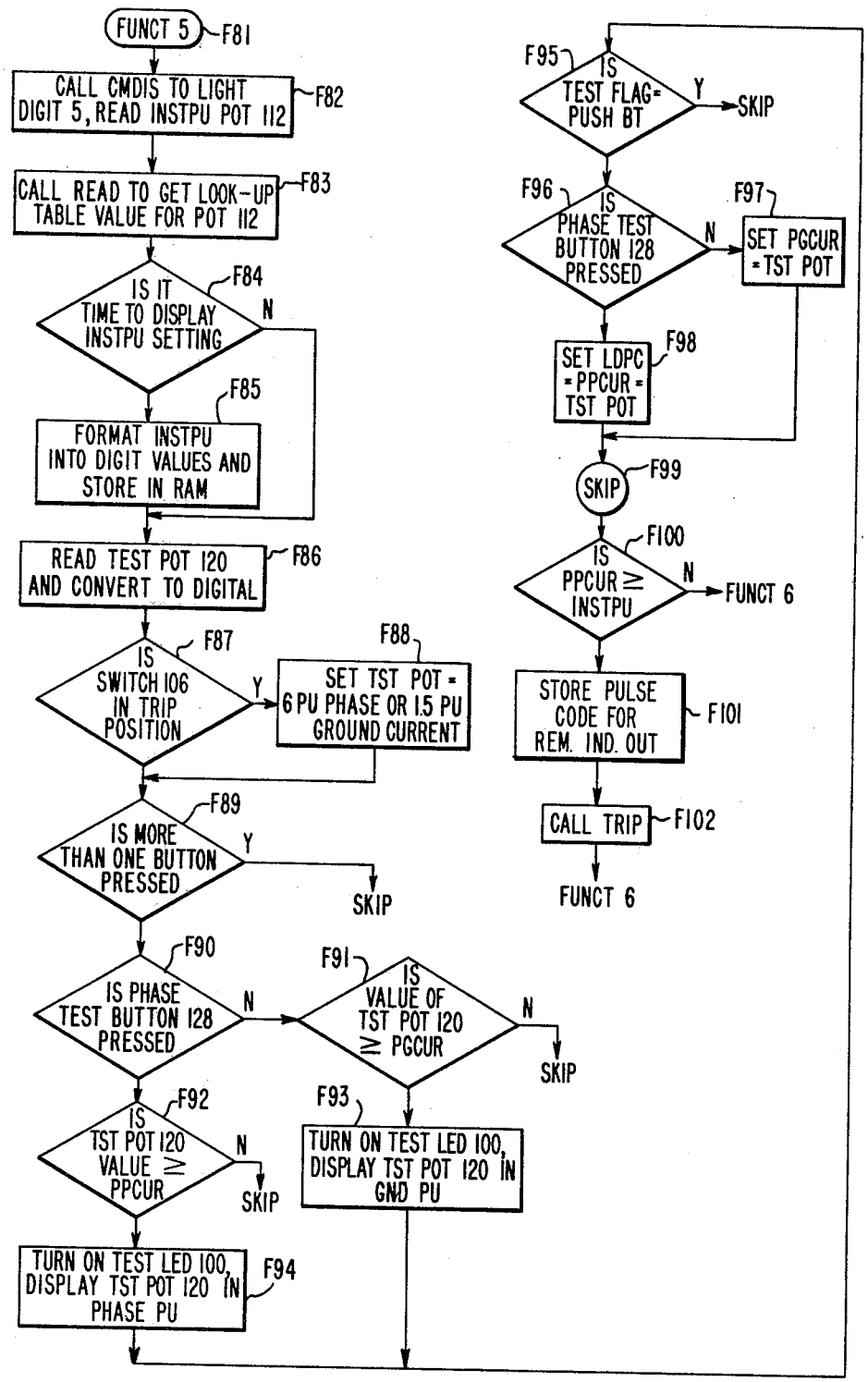
FIG. 22 is a flowchart of the fifth function of the main instruction loop shown in FIG. 17.
Figure 23:
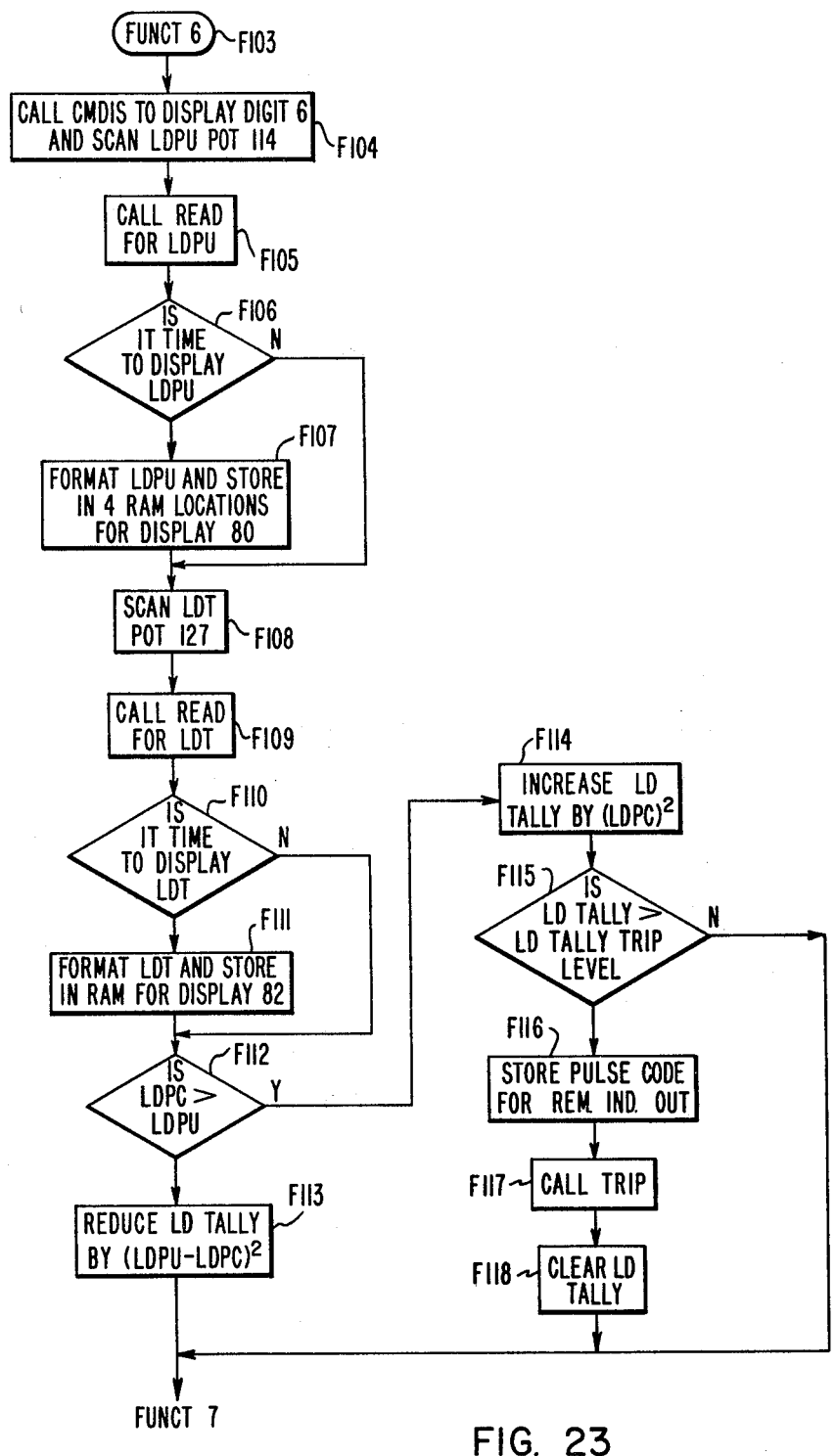
FIG. 23 is a flowchart of the sixth function of the main instruction loop shown in FIG. 17.
Figure 24:
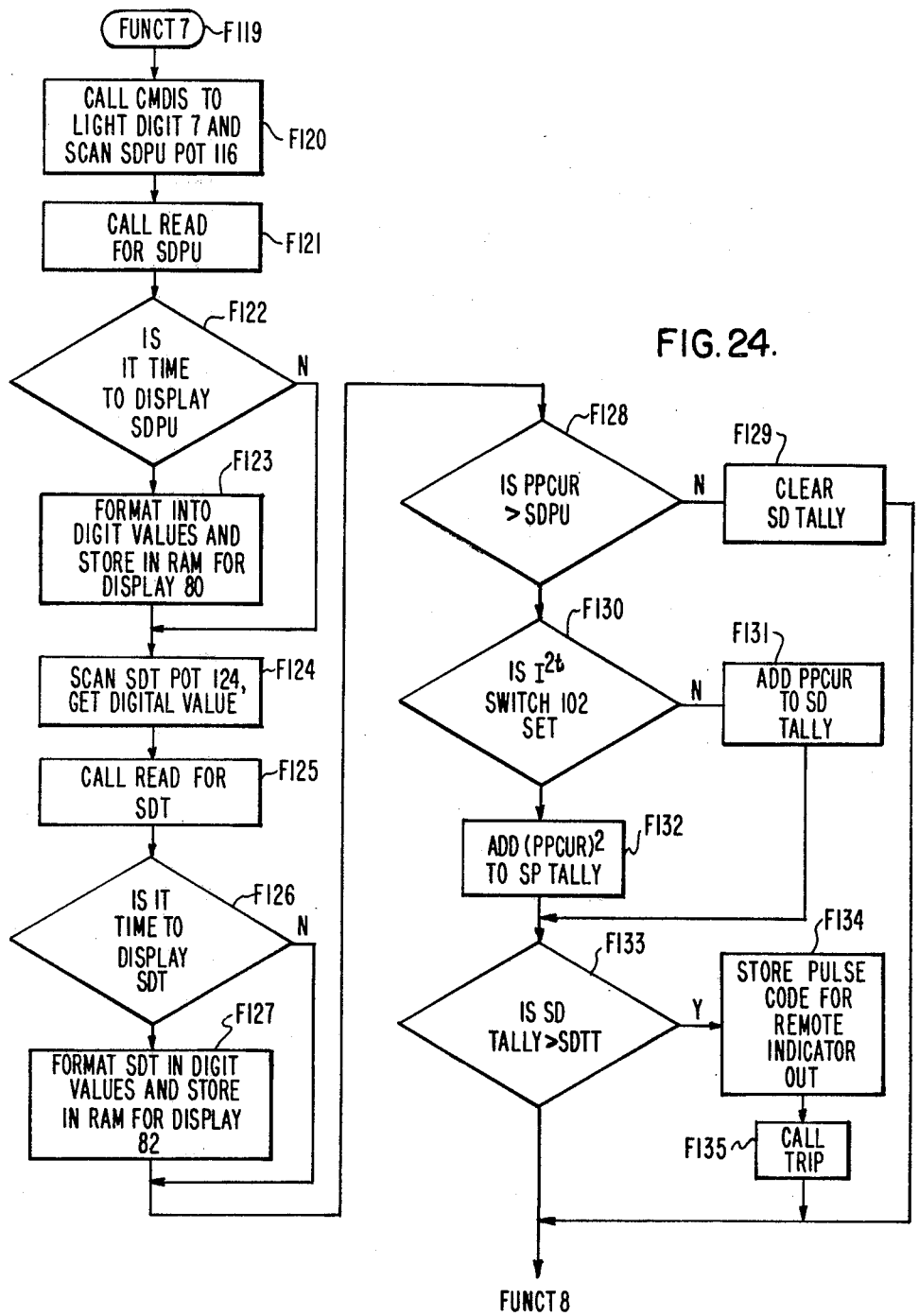
FIG. 24 is a flowchart of the seventh function of the main instruction loop shown in FIG. 17.
Figure 25:
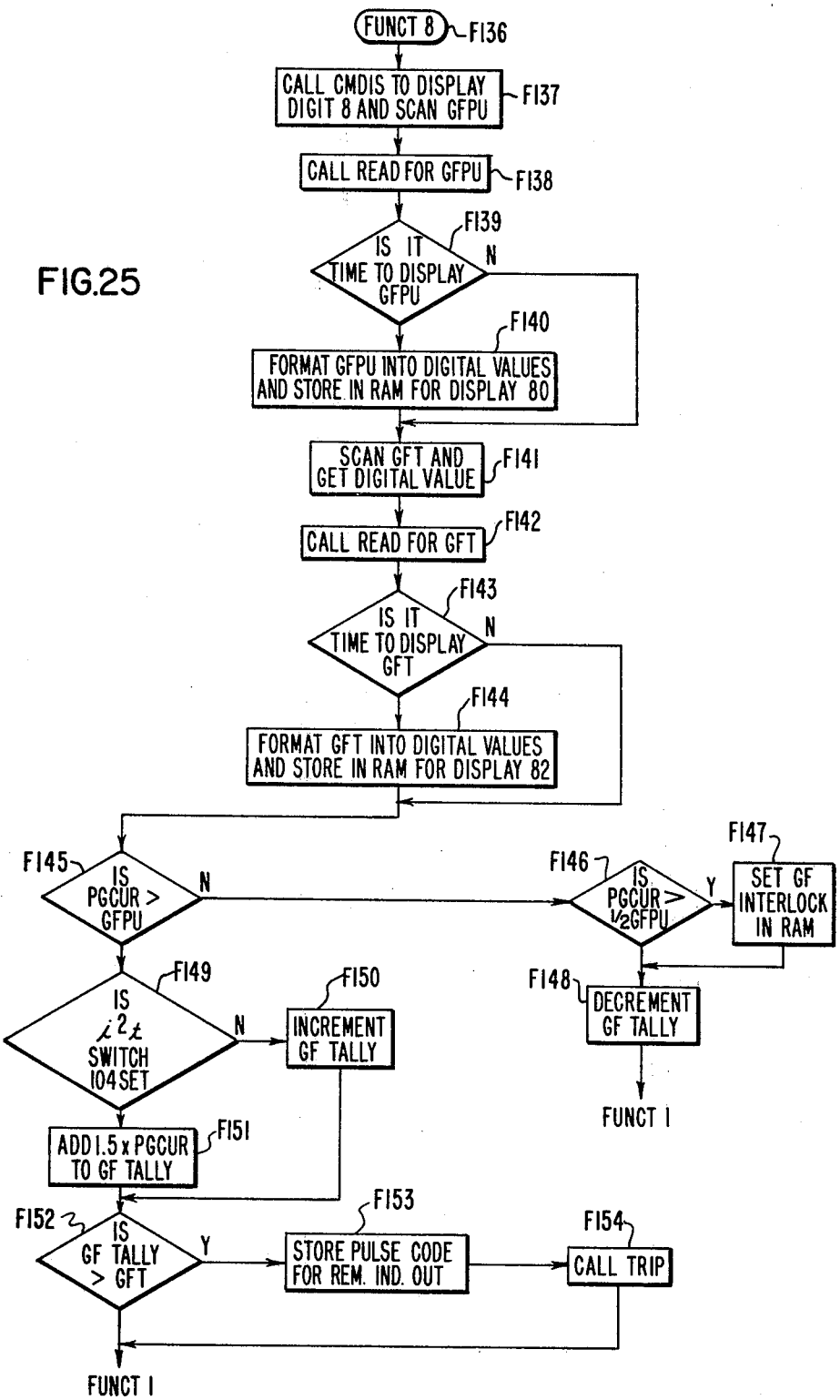
FIG. 25 is a flowchart of the eighth function of the main instruction loop shown in FIG. 17.

The organization of the main instruction loop in ROM of the microcomputer can be seen in FIG. 17. The eight main functions are named FUNCTx, where $\times$ equals 1 through 8. The major subroutines called from these functions are the common display routine CMDIS, the analog to digital conversion routine ADCV1, the subroutine to toggle between the two display panel multiplexers 166 and 168 and perform the analog to digital conversion TADCV, and the subroutine to obtain discrete values from the potentiometer settings READ. The main functions, and the corresponding subroutines will now be described in greater detail.

CMDIS-FIG. 26

This subroutine is called by each major function and thus is executed every 2 milliseconds. It displays one digit value, as addressed by register R1, and performs an analog to digital conversion on one of the eight input lines of the multiplexer 158, as specified by register R6. CMDIS outputs one pulse of 100 microsecond duration on line 7 of port 1, to energize the data input/output power supply 176. A portion of CMDIS, called TADCV, switches between multiplexer 166 and 168 to read a potentiometer from the other side of the panel. In addition, CMDIS completes a time delay to ensure that each major function executes in exactly 16.667/8 milliseconds.

Figure 26:
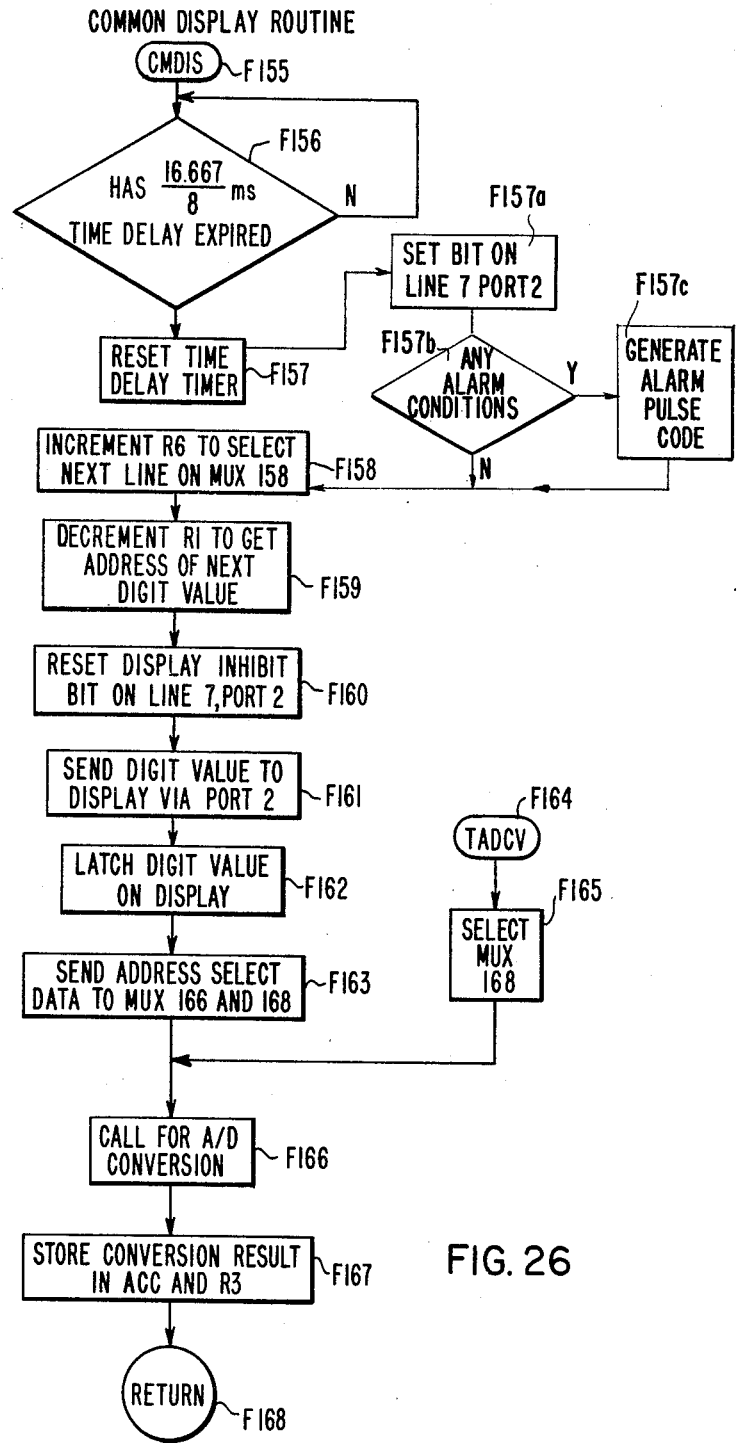
FIG. 26 is a flowchart of the common display subroutine of FIG. 17.
Figure 27:
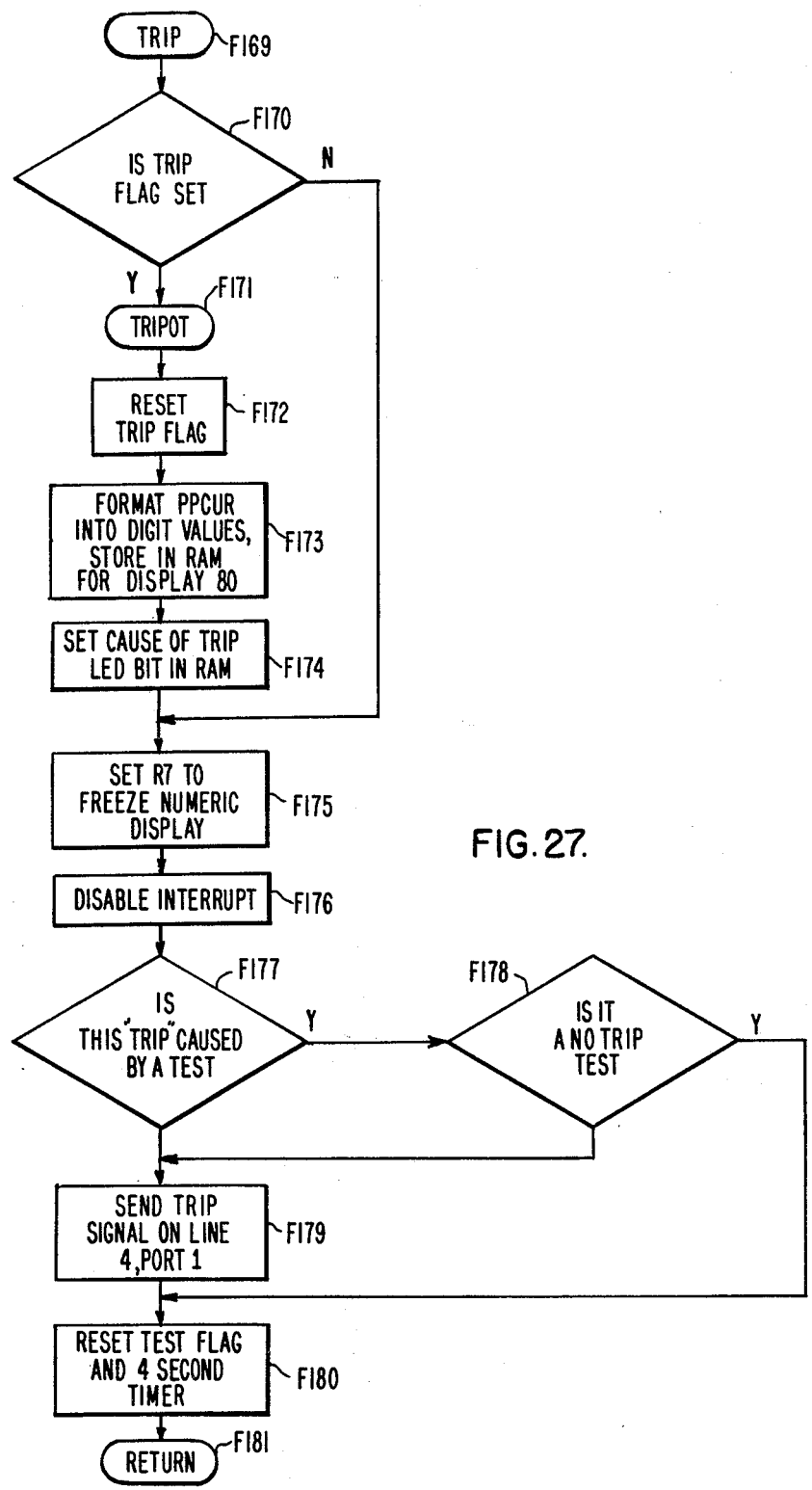
FIG. 27 is a flowchart of the trip subroutine of FIG. 17.
Figure 28:
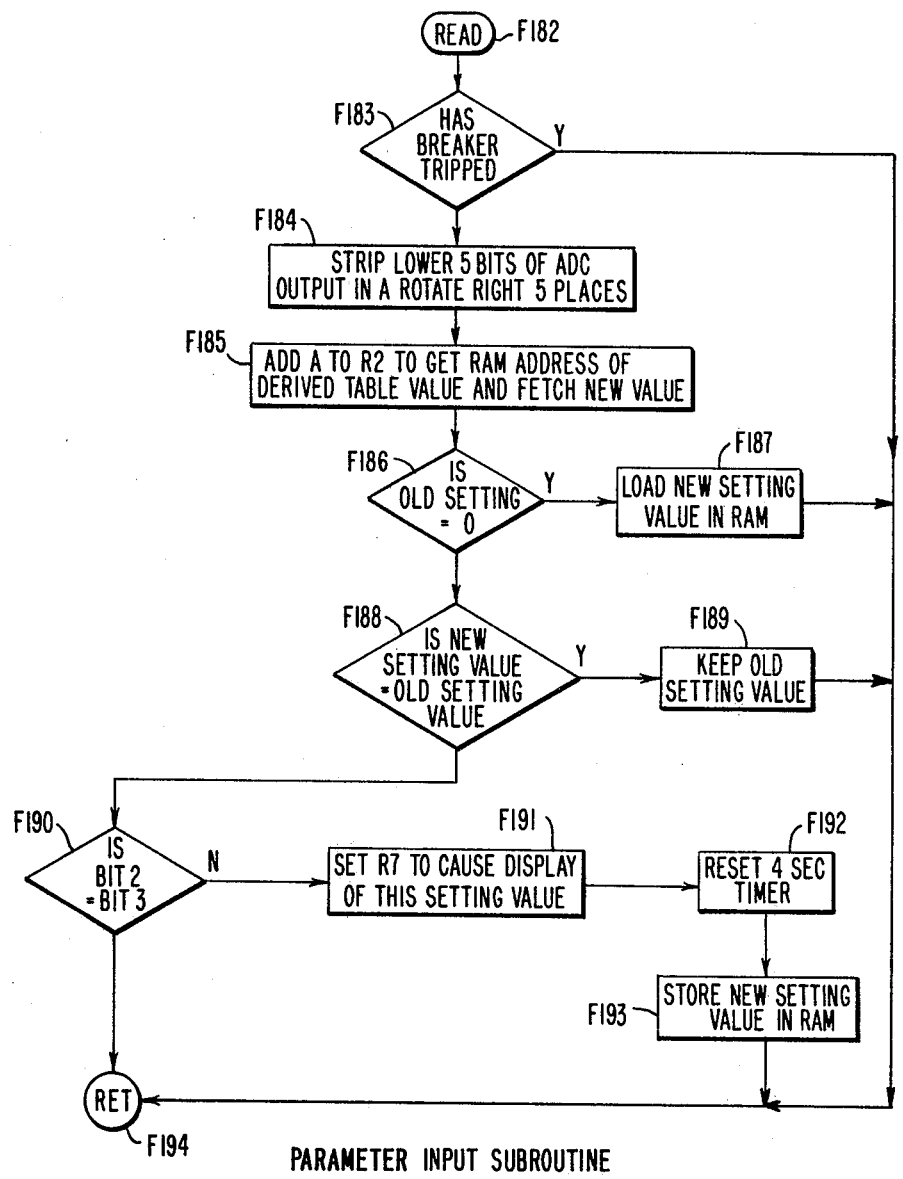
FIG. 28 is a flowchart of the subroutine to obtain setting values from the potentiometers of FIG. 5.

Reference may now be made to FIG. 26 for a more detailed description of CMDIS. An internal counter is first checked to determine if the 16.667 ms/8 execution time window has expired. If not, the subroutine loops until the window does expire. The counter is then reset.

Next, line 7 of port 1 is activated to perform two functions. The analog-to-digital converter Chip Select terminal is deactivated by this line. This line is also connected to transistor 228 of the data input/output power supply. Thus, activation of line 7 of port 1 constitutes the leading edge of an approximately 100 microsecond pulse for the data I/O power supply.

Pre-existing alarm conditions are now checked to determine if a pulse should be sent out on the serial output terminal of the optically coupled data input/output circuitry 174. As previously described, the serial output feature provides a pulse coded signal over a 16.667 millisecond time window to inform the remote indicator of possible alarm or trip conditions.

Register 6 is now incremented to obtain the channel address for the next input line of the multiplexer 158 to be accessed. Register 1 is now decremented to obtain the address of the next digit value for display.

Using register R1 as an address pointer, one of the eight digit values is now retrieved from RAM and prepared for dispatching to the numeric display indicators. Since the digit value only requires four bits, the upper four bits are used to properly set up the Latch Enable line 5 of port 2 and the inhibit line 7 of port 2 212. The LED indicator 84, 86, 88, 90, 92, 94, 96, 98 or 100 corresponding to the parameter now being displayed is controlled by bit 6 of port 2. The corresponding bit in the digit value being displayed is set or reset by the SRACE subroutine in FUNCT1. This control information and the digit value are then sent out on port 2 to the latch decoder 194 of the display system 155.

The channel address for the multiplexer 166 or 168 as contained in register 6 is now sent out on port 2. The analog to digital conversion routine ADCV1 is executed, and the digital value of the input to the multiplexer 158 is stored in register 3 and in the accumulator.

FUNCT1-FIG. 18

This function first initializes register R1 with an address one greater than the address of DIGIT1, the digit value which will be displayed in the rightmost position of the numeric displays 80 and 82 (which will be decremented by CMDIS before used). It also initializes register R6 with the first channel address to be accessed by the multiplexer 158.

Subroutine SRACE is entered next. This subroutine increments a four second counter. If this counter overflows from a hex value of FF to zero, this indicates that the four-second display period has elapsed, and it is time to command a new pair of values to appear on the numeric indicators 80 and 82. This is done by shifting the register R7. Next, SRACE sets bit 6 in one of the eight digit value RAM locations so that the appropriate LED indicator corresponding to the parameters being displayed will be lighted.

The common display routine CMDIS is now called. Upon completion, DIGIT1, the rightmost digit of the numeric display 82, will be lighted and the present phase current will have been read and processed by the ADC 156. The present phase current value is now stored in RAM.

Index register R7 is now checked to determine if it is time to display the present phase current value on the front panel numeric display indicator 80. If so, the value of present phase current is formatted into four digit values, and each of these digit values stored in the memory locations DIGIT8, DIGIT7, DIGIT6, AND DIGIT5 in RAM corresponding to the leftmost display digits, that is, the digits of the numeric indicator 80. The present ground current is also formatted into four digit values. These digit values are stored in the RAM locations DIGIT4, DIGIT3, DIGIT2, and DIGIT1 corresponding to the values of the rightmost digits, that is, the four digits of the numeric display 82.

Next, serial data I/O operations are performed, if called for, and the value of phase current used for the long delay function is read. In order to obtain a value having twice the resolution of the standard value of present phase current, the reference voltage supplied to the ADC 156 is adjusted via line 6 of port 1. The ADC is now commanded to again convert the value of the peak detector 160 as supplied through the multiplexer 158. Following the completion of the analog-to-digital conversion, the capacitor of the phase current peak detector 160 is reset by grounding the output of the multiplexer 158 through FET 186, as commanded by line 5 of port 1. The value of long delay phase current is now stored in RAM.

FUNCT1 now sends a channel address to the multiplexer 158 via port 1 to select the ground current peak detector 162. The analog to digital conversion routine ADCV 1 is called to read the ground current and convert it to a digital value. The ground current peak detector capacitor is now reset.

At higher levels of phase current, the ground current transformer 28 can generate fictitious values of ground current when no such value, in fact, exists. This effect is more noticeable as phase current increases. Therefore, the fictitious ground current is accounted for by reducing the value of ground current to be stored in RAM by a factor of ⅛ of the phase current whenever the phase current is between 1.5 per unit and 9 per unit. If the present value of phase current is greater than 9 per unit, the ground current is neglected, by zeroing the present ground current. The appropriate value of ground current is now stored in RAM.

FUNCT2-FIG. 19

This function determines the average phase current, performs energy calculations, and determines the style numer of the trip unit 126. First, the multiplexer 158 is supplied an address via port 1, as indexed by register R6 to cause the averaging circuit 164 to supply an analog value to the ADC 156. The common display routine is now called, causing DIGIT2, the second digit from the right on the numeric display indicator 82, to be lighted, and a digital value for the average phase current to be supplied. The value of average phase current is next multiplied by the product of power factor times line voltage, as specified by the front panel potentiometer 110. The result is the Present Kilowatt value, PRKW. This value is temporarily stored and is also added to the megawatthour tally. A check is next made to determine if PRKW is greater than the peak kilowatt value registered since the last actuation of the Kilowatt Reset pushbutton 105 (PKACKW). If PRKW is greater, the peak accumulated kilowatt value is set equal to PRKW, and both values stored in RAM.

A check is next made on register R7 to determine if it is time to display the present kilowatt and megawatthour values on the numeric displays 80 and 82. If so, these quantities are formatted into four digit values apiece and loaded into the digit value storage locations in RAM.

An address is now generated to the multiplexer 158 to select the style number designator 170 to be supplied to the ADC 156. An A to D conversion is now made on the style number and this value stored in RAM, to designate which of several optional features are included in the present trip unit and to select execution of the appropriate instructions farther down in ROM.

FUNCT3-FIG. 20

The first task of this function is to reset the number of pulses to be sent out over the serial output terminal. This information will later be used by the common display program to produce the proper pulse code on serial output. The common display routine is now executed, to light DIGIT3, the third digit from the right on the numeric displays and return a digital value from the Peak Kilowatt setting potentiometer 108.

Next, a flag is set to prevent an extraneous pulse from being sent on the serial output terminal. The READ routine is then executed to obtain one of eight discrete values for the Peak Kilowatt setting as specified by the corresponding potentiometer 108. This routine will be later described in greater detail.

A check is now made to determine if it is time to display the Peak Kilowatt setting on the numeric indicator 80. If so, the value of Peak Kilowatt setting as determined by the READ routine is formatted into four digit values and stored in the digit value locations in RAM corresponding to the digits of the numeric display 80.

A running tally of kilowatts is maintained in RAM. This tally is incremented by the present kilowatt value on very execution of FUNCT3, thus integrating the kilowatt values over time, producing a value corresponding to kilowatt hours. A check is now made of this location in RAM to determine if a value corresponding to 10 kilowatthours has been reached. If so, a megawatthour tally in RAM is incremented and the kilowatthour tally reset retaining the remainder. A check is made to determine if it is time to display the contents of the megawatthour tally on the display. If so, this quantity is formatted into four digit values and stored in the digit value locations in RAM corresponding to the numeric display 82.

Line 3 of port 2 is now activated to select multiplexer 166 and deselect multiplexer 168 as an input to multiplexer 158. An analog to digital conversion is now made on the panel switches 102, 104, and 106, and a digital value unique to each combination of switch settings stored in RAM.

FUNCT4-FIG. 21

The first task of FUNCT4 is to call the common display routine to light DIGIT4, the fourth digit from the right on the numeric display indicator 82, and read the PFxLV potentiometer 110 and return to a digital value therefrom. The READ routine is now called to obtain the lookup table value corresponding to the digital value of the PFxLV potentiometer 110. If it is time to display the PFxLV value, it is formatted into four digit values and stored in the RAM locations corresponding to numeric display indicator 80.

Line 3 of port 2 now selects multiplexer 166 as input through multiplexer 158 to the ADC 156, and an analog to digital conversion is ordered on the voltage divider network which includes the pushbutton switches 105, 107, 128, and 130. A unique digital value corresponding to the pattern of pushbuttons now depressed is stored in RAM. This quantity is also checked to determine if any pushbuttons have indeed been pressed. If none, then FUNCT5 is entered. Otherwise, a check is made to determine if the kilowatt reset pushbutton 105 has been pressed. If so, the value of peak kilowatts in RAM is cleared. Next, a check is made to determine if the system reset pushbutton 107 has been pressed. If so, all trip indicators are cleared, the serial output pulse codes are zeroed, the display sequence is reset, and the interrupt is enabled. If the system reset button is not being pressed, then one of the test pushbuttons 128 and 130 is. The digital value of the pushbutton read through the multiplexers 166 and 158 is now stored in a test flag.

FUNCT5-FIG. 22

The common display routine is called to light DIGIT5, the fifth digit from the right, and to read the instantaneous current pick-up potentiometer 112. The READ routine takes the digital value of the potentiometer setting supplied by the common display routine and obtains the actual setting from the look-up table in ROM. A check is now made to determine if it is time to display the instantaneous current pick-up setting of the numeric indicator 80. If so, the instantaneous pick-up value is formatted into four digit values and stored in RAM locations corresponding to the digits of the numeric indicator 80.

The TEST potentiometer 120 is now read through the multiplexers 168 and 158 and a digital value obtained. The digital value previously obtained from scanning the front panel switches is now checked to determine if the switch 106 is in the TRIP position. If so, a fixed value is loaded into the RAM location where the value of the TEST potentiometer 120 would normally be stored. This fixed value is interpreted as either 6.0 per unit for phase current or 1.5 per unit for ground current, at a later point in the execution of the test. If the switch 106 is in the NO TRIP position, a check is next made to determine if more than one pushbutton is pressed. This is an illegal condition, and no test will be performed. If it is determined that only one pushbutton is pressed, a check is made to see which one it is. If the GROUND TEST pushbutton 130 is pressed, a check is made to determine if the value of the TEST potentiometer 120 as stored in RAM is greater than or equal to the present value of ground current. If it is not, this means that the actual value of ground current now being detected by the system is greater than the value of ground current simulated by the potentiometer 120. Thus, no test will be performed and the trip unit will execute the standard ground current limit checks. If the value of the TEST potentiometer 120 as stored in RAM is greater than the present value of ground current, then indexes are set to turn on the TEST LED 100, the value of the TEST potentiometer 120 is formatted into four digit values and stored in the RAM locations corresponding to the digits of the numeric indicator 82, and the display of the numeric indicator 82 frozen.

If the PHASE TEST pushbutton 128 is pressed, a check is made to determine if the value of the TEST potentiometer 120 as stored in RAM is greater than the present phase current. If it is not, then the actual value of phase current is more critical than the simulated test value, and no test will be performed. Instead, the normal limit checks on the present phase current will be executed by the system. If the simulated test value of phase current is greater than the present value of phase current, then an index is set to turn on the TEST LED 100, the value of the TEST potentiometer 120 is formatted into four digit values and stored in RAM locations corresponding to the digits of the numeric indicator 80, and an index set to freeze the numeric indicator 80.

A check is now made to determine if the test flag is equal to the bit pattern produced by scanning the pushbuttons. If it is, this indicates that the TEST pushbutton is still being depressed. Since a test is not to be initiated until the button is released, no test will be performed at this time. If the test flag value is different from the pushbutton value, a check is made to determine if the PHASE TEST pushbutton 128 had been pressed. If so, the value of the TEST potentiometer 120 is stored in the RAM locations corresponding to present phase current and long delay phase current. If the GROUND TEST button had been pressed, then the value of the TEST potentiometer 120 is stored in the RAM location corresponding to the present ground current value. This completes the portion of the testing function incorporated in function 5.

Next, the present value of phase current is compared to the instantaneous current pick-up as specified by the potentiometer 112. If the present value of phase current is below this value, then function 6 is immediately entered. If the present value of phase current is greater than the instantaneous current pick-up level, an index is set to cause the common display subroutine to put out a pattern of pulses on the serial output terminal to indicate that an instantaneous trip has occurred and the TRIP subroutine is called, as will be explained in a later section.

FUNCT6-FIG. 23

The common display routine is executed to light DIGIT6, and read and convert the long delay pick-up potentiometer 114. The digital value of this potentiometer is now acted upon by the READ routine to obtain the table look-up value. If it is time to display the long delay pick-up value on the numeric indicators, the long delay pick up value is formatted into four digit values and stored in the RAM locations corresponding to the digits of the numeric indicator 80. Next, the long delay time potentiometer 122 is scanned and converted to a digital value, and acted on by the READ routine to obtain the table look-up value for the long delay time function.

The long delay limit check is now made, by first comparing the long delay phase current to the long delay pick-up value. If the long delay phase current is not greater than the long delay pick-up, then the long delay tally is reduced by the square of the difference between the long delay pick-up setting and the long delay phase current. FUNCT7 is then entered.

If the long delay phase current is greater than the long delay pick-up value, then the long delay tally is incremented by the square of the long delay phase current. A check is now made to determine if the long delay tally is greater than the value of long delay tally specified for a long delay trip. If not, FUNCT7 is then entered. If the current value of the tally is greater than the trip level, a code is stored in RAM to cause the common display program to generate the proper pulse code over the serial output terminal to indicate a long delay trip. Next, the TRIP subroutine is called, and the long delay tally cleared. FUNCT7 is then entered.

FUNCT7-FIG. 24

The common display program is called to light DIGIT7 and obtain a digital value for the setting of the short delay pick-up potentiometer 116. The READ routine is then called to obtain the proper table look-up value for short delay pick-up corresponding to the digital value scanned from the potentiometer. A check is made to determine if it is time to display the short delay pick-up function. If so, the short delay pick-up value is formatted into four digit values and stored in the RAM locations corresponding to the digits of numeric display indicator 80.

Line 3 of port 2 is now activated to select multiplexer 166, scan the short delay time potentiometer 124, and obtain a digital value therefrom. The table look-up value for short delay time is then obtained through the READ routine. If it is now time to display the short delay time value, the short delay time value is formatted into four digit values and stored in the RAM locations for display as digits 1 through 4 in numeric display 82.

The short delay limit value check is now performed, by first comparing the present phase current to the short delay pick-up setting. If the pick-up setting is not exceeded, then the short delay tally is cleared and FUNCT8 entered.

If the present phase current is greater than the short delay pick-up value, the RAM location corresponding to the pattern of switches 102, 104 and 106 is checked to determine if the short delay $I^2T$ function is called for, via the switch 102. If so, the square of the present phase current is added to the short delay tally, and the new value of the short delay tally compared to the short delay tally trip level. If the trip level is exceeded, pulse code for serial out and remote indicator is stored and the TRIP subroutine is called. If the tally trip level is not exceeded, then FUNCT8 is entered.

If the $I^2T$ function was not specified for the short delay test, then the present phase current value is added to the short delay tally and a comparison made to determine if the new value of the short delay tally now exceeds the short tally trip level. If not, FUNCT8 is immediately entered. If the tally trip level is exceeded, the pulse code for serial out and remote indicators is stored and TRIP routine is called before entering FUNCT8.

FUNCT8-FIG. 25

The common display routine is called to light DIGIT8, the leftmost digit in numeric display indicator 80 and to scan and convert the ground fault pick-up potentiometer 118. The look-up table value for ground fault pick-up corresponding to the digital value of the potentiometer 118 is then determined by the READ routine and stored in RAM. If it is now time to display the ground fault pick-up value, this quantity is formatted into four digit values and stored in the RAM locations corresponding to the four digits of the numeric indicator 80.

The ground fault time potentiometer 126 is now scanned and a digital value obtained therefor. The READ routine then determines the look-up table value corresponding to the digital value for the potentiometer 126. If it is time to display the ground fault time value, this quantity is formatted into four digit values and stored in the RAM locations corresponding to the four digits of the numeric indicator 82.

A test is now made to determine if the present value of ground fault current is greater than the ground fault pick-up level. If not, an additional test is made to determine if the present value of ground fault current is greater than one-half of the ground fault pick-up level. If so, the ground fault interlock flag is set in RAM. The ground fault tally is then determined and the loop returns to FUNCT1.

If the present value of ground fault current is greater than the ground fault pick-up level, the location in RAM specifying the front panel switch pattern is then checked. If the ground fault $I^2T$ switch 104 is set, a quantity equal to 1.5 times the present value of ground fault current is added to the ground fault tally. If the $I^2T$ switch 104 is not set, then the ground fault tally is merely incremented.

Next, a check is made to determine if the ground fault tally is greater than the ground fault time limit value. If not, the main loop is entered once again at FUNCT1. If the tally is greater than the ground fault time, then a pulse code is stored to allow the proper pulse pattern to be transmitted on the serial output terminal, and the TRIP routine is called prior to returning to the top of the main loop at FUNCT1.

TRIP-FIG. 27

This subroutine is executed whenever electrical conditions on the circuit breaker exceed the time-current characteristic limit values as entered through the front panel of the trip unit 26. The out-of-limit conditions are detected by the calling functions of the main loop instructions stored in the ROM.

The TRIP subroutine first checks the trip flag to determine if this trip condition was detected on a previous execution of the main loop. If so, the next step is to set register R7 to freeze the numeric display. If this is the first time the trip condition has been detected, then the trip flag is reset and the present value of phase current is loaded into the digit value locations in RAM corresponding to the digits of numeric display 80. Next, bit 6 of the appropriate digit value location in RAM is set, to cause the proper LED to be lighted on the front panel to display that function which caused the trip operation. Note that when bit 6 of a digit value is sent out on port 2, line 6 of port 2 will be actuated when and only when the digit connected to the proper LED is lighted. This will turn on the transistor 208, lighting the proper LED.

Register R7 is then set to freeze the numeric display and prevent any of the functions of the main loop from attempting to display a different quantity. The interrupt is now disabled and a check is made to determine if this call to the TRIP routine was the result of a test being performed; that is, as a result of the operator having passed either the PHASE TEST button 128 or the GROUND TEST button 130. If so, a check is next made to determine if the switch 106 is in the NO TRIP position. If so, the routine resets the test flat and four second timer and returns to the calling location.

If the switch 106 is in the TRIP position, or if the call to the TRIP subroutine was not caused by a test, then line 4 of port 1 is actuated. This sends a signal over the line 190 of FIG. 2 to the transistor 192, actuating the trip coil 22 and causing the contacts 18 to open. The test flag and four second timer are reset and the subroutine returns to the calling location.

READ-FIG. 28

This subroutine performs a table look-up function to allow the limit value setting potentiometers on the front panel of the trip unit 26 to select any of eight discrete values rather than a continuously variable output. In addition, the subroutine provides a hysteresis effect when adjusting the potentiometers to eliminate the undesirable variation of potentiometer values on ambient temperature and provide greater ease and convenience in adjustment.

Upon entry to the READ routine, register R0 contains the address in RAM of the location where the parameter value being read will be stored, register R2 contains the beginning address of the table of eight values which can be selected by the potentiometer, and the accumulator and register R3 both contain the digital value of the voltage setting produced by the potentiometer, as supplied by the ADC 156.

A check is first made to determine if a tripping operation has already occurred. If so, the subroutine is immediately exited. Otherwise, the eight-bit digital value of the potentiometer voltage setting has its lower five bits stripped off and the three most significant digits rotated to become the least significant bits. The accumulator thus contains a binary number having a decimal value from 0 to 7. This quantity is then added to the address of the beginning of the table, as stored in register R2, yielding the address in RAM of the table value selected by this particular adjustment of the potentiometer. The value thus obtained may or may not be used to update the specific parameter being adjusted, depending on the previous value of this potentiometer.

If the old setting is equal to zero, then a start-up condition exists. The new setting is immediately loaded into the appropriate RAM location and the subroutine READ is exited.

If the new setting as obtained from the lookup table is equal to the old setting, then the old setting is reloaded into RAM at the address specified by register R0. If the new setting is unequal to the old setting then the hysteresis test is performed.

Essentially, the hysteresis test examines the entire eight-bit output of the ADC 156, as scanned from the potentiometer. If bits 1 and 2 are equal, that is, if they are either 00 or 11, then the new setting is ignored and the old setting is reloaded into RAM. The purpose of this action can be understood by reference to TABLE I, wherein eight values out of the 128 possible combinations of ADC output are shown. As has already been explained, the most significant bits, that is bits 5, 6 and 7, determine the setpoint of the potentiometer. As can be seen in TABLE I, the potentiometer setting in binary notation will increase from 100 to 101 as the analog-to-digital converter output moves from value D to value E. By ignoring a change in potentiometer setting wherein bits 1 and 2 are either 11 or 00, a hysteresis effect is obtained.

TABLE I

| Bit Number: | 7 | 6 | 5 | 4 | 3 | 2 | 1 | 0 | Value |
|---|---|---|---|---|---|---|---|---|---|
| | 1 | 0 | 0 | 1 | 1 | 1 | 0 | 0 | A |
| | 1 | 0 | 0 | 1 | 1 | 1 | 0 | 1 | B |
| | 1 | 0 | 0 | 1 | 1 | 1 | 1 | 0 | C |
| | 1 | 0 | 0 | 1 | 1 | 1 | 1 | 1 | D |
| | 1 | 0 | 1 | 0 | 0 | 0 | 0 | 0 | E |
| | 1 | 0 | 1 | 0 | 0 | 0 | 0 | 1 | F |
| | 1 | 0 | 1 | 0 | 0 | 0 | 1 | 0 | G |
| | 1 | 0 | 1 | 0 | 0 | 0 | 1 | 1 | H |

Remembering that the hysteresis test is only performed if there is a change in the upper three bits of the ADC output, it can be seen that an increase in ADC output from value B to value C will not result in a new value being stored, since the upper three bits of B and C are the same. An increase from value B to value G, however, would clearly result in a new value being stored, since bit 5 of the output changed from a zero to a one.

Without the hysteresis test being performed, an increase in ADC output from value C to value F would similarly result in a new potentiometer value being stored. However, this represents a change in value of about 3/256 of the maximum potentiometer, or less than 1.2%. Such variation can easily occur due to changes in ambient temperature.

Through the use of the hysteresis test, wherein ADC outputs having equal values of bits 1 and 2 are ignored, it can be seen that a change in ADC output from value C to value F would result in the new potentiometer setting being ignored and the old potentiometer setting being reloaded into RAM, since bits 1 and 2 of value F are both zero. Similarly, if the operator were reducing the value of the potentiometer, causing an ADC output to change from value G to value C the new value would also be ignored and the old value retained, since bits 1 and 2 of value C are both one, and the hysteresis test would reject the new setting. It can therefore be seen that the hysteresis test insures that the potentiometer setting must be changed by more than 4/256 of its total possible adjustment before a new setting will be accepted. It can be argued that the hysteresis test just described is not sufficiently precise, in that a valid setting change may possibly be ignored. This might occur, for example, if the old potentiometer setting produced an ADC output much larger than value H, for example 10110101, and the new potentiometer setting produced an ADC output equal to value D. It can be seen that this represents a very large excursion in the rotation of the potentiometer, and yet the final position producing a value equal to value D would be ignored, since bits 1 and 2 are both ONE's. It must be remembered, however, that an interactive operation is being performed, and that the parameter value selected by the READ routine is, from the point of view of a human operator, instantaneously presented on the numeric displays 80 or 82. In the example just cited, the operator would see that a fairly large excursion of the potentiometer produced no change in value, and he would naturally make an even further adjustment. At some point, his further adjustments would result in a new value being selected by the READ routine and presented under numeric display. If the change produced were larger than desired, the operator would then readjust in the opposite direction, the entire operation taking much less time to perform than to explain. This represents an extremely cost-effective and convenient method of entering parameter changes for the time current tripping characteristic into a circuit breaker. Adjustment of the potentiometer to the extreme upper and lower limits will cause the most conservative value to be displayed.

In the event that bit 2 is not equal to bit 3, that is the hysteresis test does not cause the setting to be ignored, a bit pattern is loaded in register R7 to cause display of this setting value on the numeric displays 80 or 82. The four-second timer is then reset and the new setting value is stored in the RAM location corresponding to this particular parameter. The subroutine then returns to the calling function.

If an ADC output of all zero's or all one's is obtained, the READ routine interprets this as a potentiometer failure. The most conservative parameter value is then selected from the look-up table, displayed on the numeric display 80 or 82, and stored in RAM.

I. Hardware Initialization After Power-On-FIG. 16

The microcomputer 154 must be initialized following power-up. In the case of the Intel 8048 device this is accomplished by means of a RS pin which if held low causes the program to "jump" to address 0 which by convention is the starting address of the power-on start-up subroutine. The RS pin is held low by the power supply by means of D900 for about 5 ms, after the +5 VDC is applied.

However, the RS pin does not affect the I/O lines from the microcomputer and thus during the power ON transient these may assume either a high or low output state which, in the case of four particular lines of Port 1 and Port 2, can cause excessive power supply drain or even accidental tripping of the circuit breaker 10 or other interconnected breakers. These lines are as follows:
1. LED (line 6 of Port 2—should be low to ensure all LED indicators on front panel are OFF).
2. INHIBIT 212 (line 7 of Port 2—should be tristated, that is, held in a high-impedance state to ensure that all 8 digits of the 7-segment LED displays 80 and 82 are OFF).
3. PULSE 178 (line 7 of Port 1—should be tristated to ensure that pulse transformer 501 is OFF).
4. TRIP 190 (line 4 of Port 1—should be tristated to ensure that no false trip occurs on power-on).

The desired tristating is achieved by means of hex buffer U900. When RS of the microcomputer 154 is low, the DISABLE (A) of U900 is low (removed) which causes DISABLE (B) to be high (active). In this way the four critical leads from the microcomputer 154 are switched to the high impedance state, except for LED which is held low as desired by the pull-down resistor R905.

Figure 16:
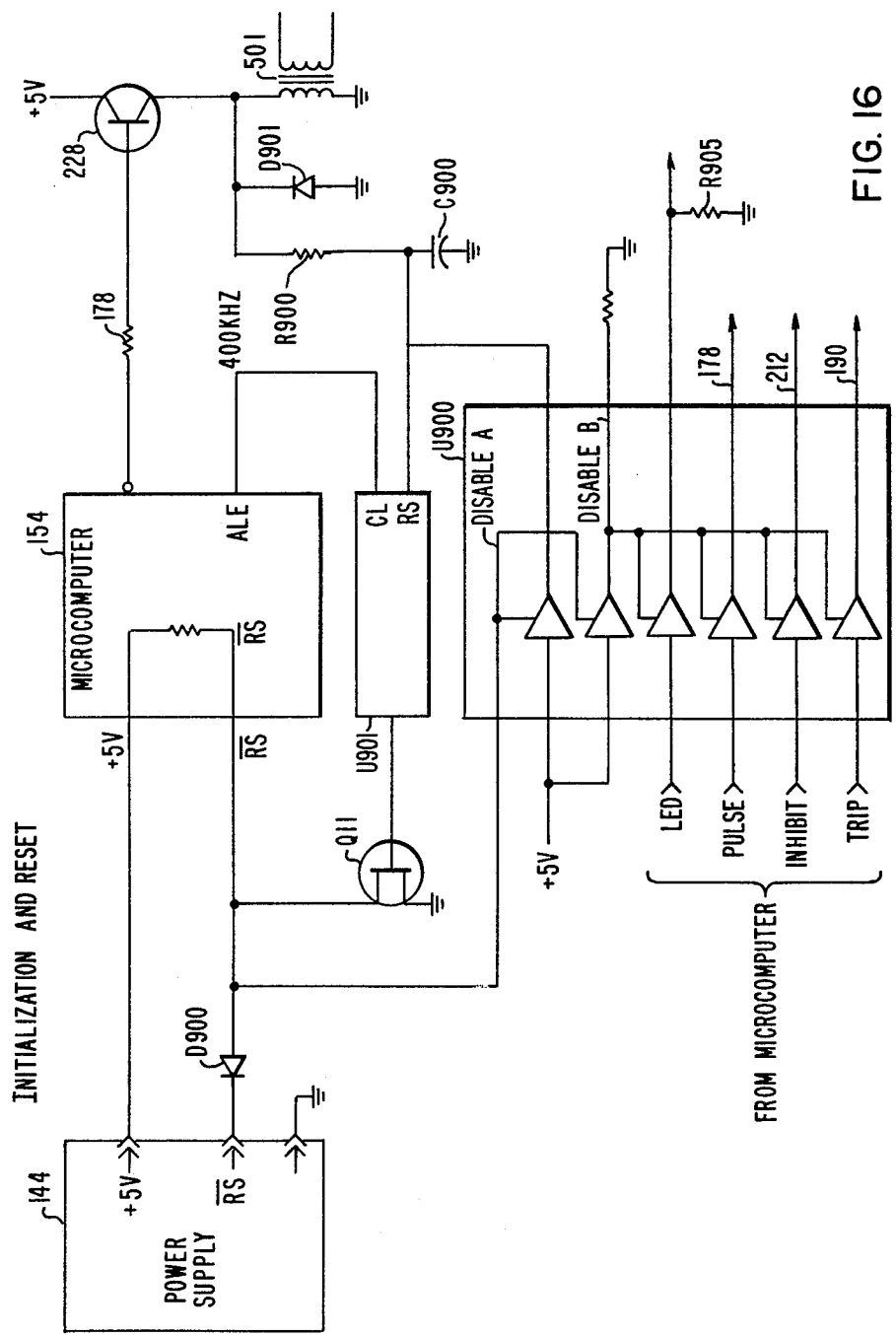
FIG. 16 is a schematic diagram of a power-on hardware initialization and automatic reset circuit.

A second function of U900 is to reset counter U901 as shown in FIG. 16.

J. Automatic Reset-FIG. 16

Once a successful power-up transition is made, the microcomputer 154 continues to execute a logical and sequential series of instructions indefinitely. Under unusual conditions, such as those produced by electrical system transients, it is possible for an instruction to be improperly executed. The only way to restore the microcomputer 154 to its orderly program execution is to perform another reset operation. In unattended applications, this reset must be automatic.

This is accomplished by means of counter U901 which utilizes a 400 kHz clock output (ALE) from the microcomputer 154 to provide a fixed time delay between the last U901 RS pulse and a high on Q11 (RS for the μC). If the RS pulse of U901 occurs soon enough, Q11 will remain low and the μC will not be reset.

The U901 RS pulses are derived from the collector of transistor 228. Normally these pulses are 100 μs wide and occur approximately every 2 ms. The circuit is designed so that 5.46 ms is required for Q11 to time out (go high) and thus Q11 is always low.

If improper instruction execution sequence occurs, the following possible conditions would cause an automatic reset of the microcomputer (Q11 would time out).

228-ON

If this condition should exist for more than 300 μs, pulse transformer 501 will saturate and U901 RS will remain low.

228-OFF

If this condition should exist, U901 RS will remain low.

228-Pulse Rate Too Slowly

If transistor 228 turn-on pulses occur less than every 5.46 ms, the U901 RS will be low long enough for a μC reset to occur.

228-Pulsed Too Fast

Rapid pulsing of transistor 228 will be filtered by R900 and C900 (39 μs time constant).

228-ON/OFF Duty Cycle > 1/10

Transformer T501 is pulsed on for 100 μs, to a voltage of 5 volts, by transistor 228. When 228 is turned OFF, the transformer's magnetizing current will flow through diode D901 which will result in a voltage of about −0.5 volts being applied to the transformer 501. The average voltage of the transformer must be zero and thus 1000 μs $$\left( \frac{5V}{.5V} \times 100\ \mu s \right)$$

will be required to "reset" the transformer's magnetizing current to zero. A 1-to-10 or less ON-to-OFF ratio must be maintained for the transformer 501 to function or the transformer's core will ultimately saturate. If transformer 501 is saturated, the RS pulses will not be applied to U901 and Q11 will time out and reset the microcomputer.

What we claim is:
1. Self-contained circuit interrupter apparatus, comprising:
   interrupter means for conducting current flow in an associated circuit and for operating to interrupt the current flow therethrough on command;
   sensing means for sensing current flow through said interrupter means and for supplying operating power to said apparatus;
   trip unit means connected to said interrupter means and said sensing means for operating said interrupter means when current flow therethrough exceeds predetermined limits;
   voltage means for obtaining the value of line voltage on the associated circuit;
   power factor means for obtaining the value of power factor on the associated circuit;

arithmetic means connected to said current sensing means, said voltage means, and said power factor means for calculating real power flow through the associated circuit;

a housing enclosing said apparatus; and display means visible from the exterior of said housing and connected to said arithmetic means for displaying the numeric value of said product as real power being delivered by the associated circuit.

2. Apparatus as recited in claim 1 wherein said voltage means comprises a potential transformer connected to the associated circuit and said arithmetic means comprises an analog-to-digital converter and a microcomputer, said microcomputer commanding said analog-to-digital converter to periodically sample the line voltage and instantaneous phase current of the associated circuit and to form the product of the instantaneous values of the line voltage and phase current to compute real power being delivered by the associated circuit.

3. Apparatus as recited in claim 1 comprising averaging means connected to said sensing means for determining the average value of phase current of an associated circuit and for supplying said average value to said arithmetic means and wherein said power factor means comprises means for receiving an operator-entered value of the power factor on the associated circuit and said voltage means comprises a potential transformer; said arithmetic means forming the product of line voltage, average phase current, and power factor to determine real power being delivered by an associated circuit; and said trip unit means supplying said value of real power to said display means.

4. Apparatus as recited in claim 1 comprising averaging means connected to said sensing means for determining the average value of phase current on the associated circuit and for supplying said average value to said arithmetic means, and wherein said voltage means and said power factor means comprises first entry means for receiving an operator-entered value of the product of line voltage and power factor on the associated circuit, said arithmetic means computing the product of average value of phase current and said operator-entered value to determine real power being delivered by the associated circuit and supplying said real power value to said display means.

5. Apparatus as recited in claim 4 comprising second entry means for receiving an operator-entered limit value of peak demand power, and comparator means for comparing said computed value of real power being delivered through the associated circuit to said limit value and for generating an external alarm signal when power delivered through the associated circuit exceeds said limit value.

6. Apparatus as recited in claim 4 comprising memory means connected to said display means for storing the peak value of computed real power delivered through the associated circuit and for providing an externally visible indication of the numeric value of said peak computed power.

7. Apparatus as recited in claim 6 comprising means for resetting said stored value of peak real power.

8. Apparatus as recited in claim 4 wherein said trip unit means comprises integration means connected to said display means for integrating said computed values of real power over time to calculate the value of energy delivered through the associated circuit, and for supplying said calculated energy value to said display means.

9. Apparatus as recited in claim 8 comprising reset means for resetting all initializable quantities in said apparatus except said value of integrated real power, whereby said calculated value of delivered energy is reset only upon failure of operating power to said apparatus.

10. Apparatus as recited in claim 1 wherein said sensing means comprises a current transformer having the current flow through said interrupter means as the primary current flow of said current transformer.

* * * * *